(12) United States Patent
Han et al.

(10) Patent No.: US 10,734,493 B2
(45) Date of Patent: Aug. 4, 2020

(54) SEMICONDUCTOR MEMORY DEVICE AND CONDUCTIVE STRUCTURE

(71) Applicant: Samsung Electronics Co., Ltd., Suwon-si, Gyeonggi-do (KR)

(72) Inventors: Hauk Han, Hwaseong-si (KR); Je-hyeon Park, Suwon-si (KR); Do-hyung Kim, Seongnam-si (KR); Tae-yong Kim, Daegu (KR); Keun Lee, Cheongju-si (KR); Jeong-gil Lee, Hwaseong-si (KR); Hyun-seok Lim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/029,993

(22) Filed: Jul. 9, 2018

(65) Prior Publication Data
US 2019/0013388 A1 Jan. 10, 2019

(30) Foreign Application Priority Data
Jul. 10, 2017 (KR) .......................... 10-2017-0087284

(51) Int. Cl.
| | |
|---|---|
| *H01L 29/423* | (2006.01) |
| *H01L 29/51* | (2006.01) |
| *H01L 29/66* | (2006.01) |
| *H01L 29/78* | (2006.01) |
| *H01L 29/49* | (2006.01) |

(Continued)

(52) U.S. Cl.
CPC .... *H01L 29/42372* (2013.01); *H01L 27/1157* (2013.01); *H01L 27/11582* (2013.01); *H01L 29/4966* (2013.01); *H01L 29/517* (2013.01); *H01L 29/6653* (2013.01); *H01L 29/66795* (2013.01); *H01L 29/7827* (2013.01);
(Continued)

(58) Field of Classification Search
None
See application file for complete search history.

(56) References Cited

U.S. PATENT DOCUMENTS

| | | | |
|---|---|---|---|
| 6,348,402 B1 | 2/2002 | Kawanoue et al. | |
| 2008/0122007 A1* | 5/2008 | Kawai ............... | H01L 21/82381 257/374 |

(Continued)

FOREIGN PATENT DOCUMENTS

| | | |
|---|---|---|
| JP | 2014067866 A | 4/2014 |
| KR | 19980026305 U | 8/1998 |

(Continued)

*Primary Examiner* — Peter Bradford
(74) *Attorney, Agent, or Firm* — Harness, Dickey & Pierce, P.L.C.

(57) ABSTRACT

A semiconductor memory device may include a substrate, gate electrode structures stacked on the substrate, insulation patterns between the gate electrode structures, vertical channels penetrating through the gate electrode structures and the insulation patterns, and a data storage pattern. The vertical channels may be electrically connected to the substrate. The data storage pattern may be arranged between the gate electrode structures and the vertical channels. Each of the gate electrode structures may include a barrier film, a metal gate, and a crystal grain boundary plugging layer. The crystal grain boundary plugging layer may be between the barrier film and the metal gate.

16 Claims, 21 Drawing Sheets

(51) Int. Cl.
*H01L 27/11582* (2017.01)
*H01L 27/1157* (2017.01)
*H01L 29/786* (2006.01)

(52) U.S. Cl.
CPC .... *H01L 29/7833* (2013.01); *H01L 29/66545* (2013.01); *H01L 29/78642* (2013.01)

(56) References Cited

U.S. PATENT DOCUMENTS

| | | | |
|---|---|---|---|
| 2015/0024592 A1* | 1/2015 | Chandrashekar | ............................ H01L 21/67207 438/675 |
| 2015/0357426 A1 | 12/2015 | Kim et al. | |
| 2016/0027639 A1 | 1/2016 | Hou et al. | |
| 2016/0372359 A1 | 12/2016 | Kong et al. | |
| 2017/0040214 A1 | 2/2017 | Lai et al. | |
| 2018/0090438 A1* | 3/2018 | Kitamura | .......... H01L 27/11578 |
| 2018/0342518 A1* | 11/2018 | Kim | .................. H01L 21/76224 |

FOREIGN PATENT DOCUMENTS

| | | |
|---|---|---|
| KR | 100212017 B1 | 8/1999 |
| KR | 20040077421 A | 9/2004 |
| KR | 20050041553 A | 5/2005 |
| KR | 100525110 B1 | 11/2005 |
| KR | 100673881 B1 | 1/2007 |
| KR | 100687881 B1 | 2/2007 |

* cited by examiner

SEMICONDUCTOR MEMORY DEVICE AND CONDUCTIVE STRUCTURE

CROSS-REFERENCE TO RELATED APPLICATION

This application claims the benefit of Korean Patent Application No. 10-2017-0087284, filed on Jul. 10, 2017, in the Korean Intellectual Property Office, the disclosure of which is incorporated herein in its entirety by reference.

BACKGROUND

Inventive concepts relate to a semiconductor memory device, and more particularly, to a semiconductor memory device and a conductor structure with high device reliability.

Vertical semiconductor devices having memory cells arranged three-dimensionally in vertical directions are being proposed for high integration of semiconductor devices. However, structures of such semiconductor devices are becoming more and more complicated, and it is becoming more difficult to uniformly form a specific material film due to the complicated structures. Therefore, different ways for forming a material film may be explored.

SUMMARY

Inventive concepts relate to a semiconductor memory device with high device reliability.

Inventive concepts also relate to a conductor structure with high device reliability.

According to some example embodiments of inventive concepts, a semiconductor memory device may include a substrate, a plurality of gate electrode structures stacked on the substrate, insulation patterns between the plurality of gate electrode structures, vertical channels penetrating through the plurality of gate electrode structures and the insulation patterns, and a data storage pattern. The vertical channels may be electrically connected to the substrate. The data storage pattern may be between the plurality of gate electrode structures and the vertical channels. Each of the plurality of gate electrode structures may include a barrier film, a metal gate, and a crystal grain boundary plugging layer between the barrier film and the metal gate.

According to some example embodiments of inventive concepts, a semiconductor memory device may include a substrate, a plurality of gate electrode structures stacked on the substrate, insulation patterns between the plurality of gate electrode structures, vertical channels penetrating through the plurality of gate electrode structures and the insulation patterns, and a data storage pattern. The vertical channels may be electrically connected to the substrate. The data storage pattern may be between the plurality of gate electrode structures and the vertical channels. Each of the plurality of gate electrode structures may include a metal nitride layer on a surface of a metal gate. The metal nitride layer may include an oxygen-enriched layer.

According to some example embodiments of inventive concepts, a conductor structure may include an insulation layer including a recessed portion, a barrier film conformally disposed in the recessed portion, a metal layer on the barrier film and filling the recessed portion, and a crystal grain boundary plugging layer between the barrier film and the metal layer.

BRIEF DESCRIPTION OF THE DRAWINGS

Inventive concepts will be more clearly understood from the following detailed description taken in conjunction with the accompanying drawings in which.

DETAILED DESCRIPTION

Figure 1:
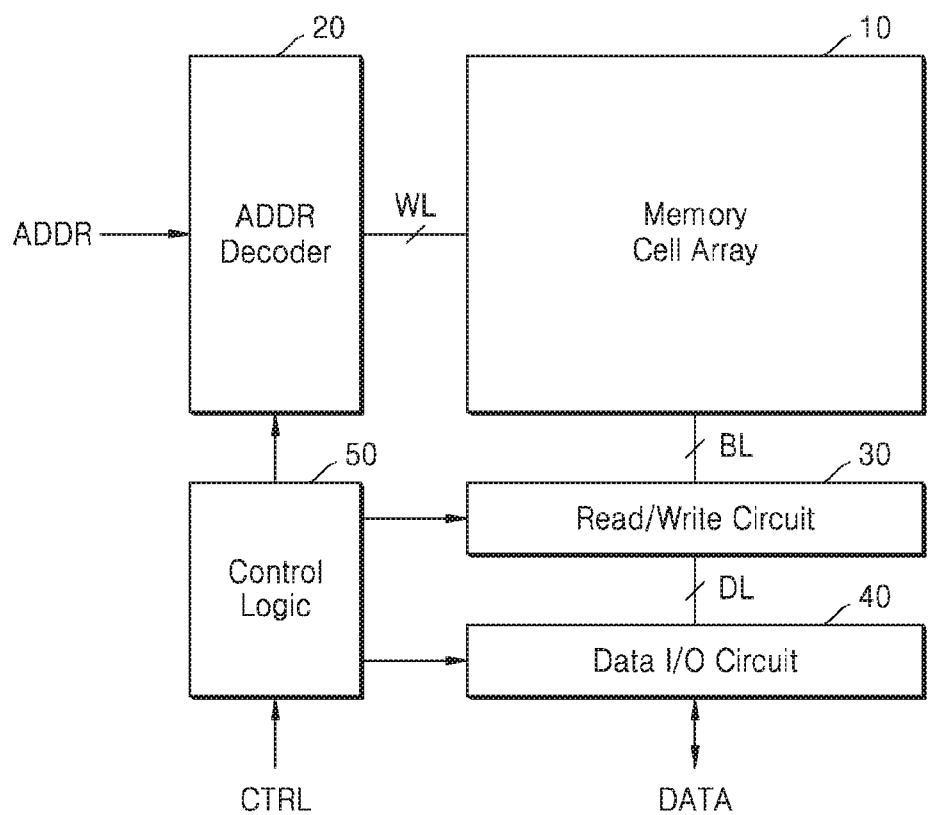
FIG. 1 is a block diagram showing a semiconductor device according to some example embodiments of inventive concepts.

FIG. 1 is a block diagram showing a semiconductor device according to example embodiments of inventive concepts.

Referring to FIG. 1, a semiconductor device according to some example embodiments of inventive concepts may include a memory cell array 10, an address decoder 20, a read/write circuit 30, a data input/output circuit 40, and a control logic 50.

The memory cell array 10 may be connected to the address decoder 20 via a plurality of word lines WL and may be connected to the read/write circuit 30 via a plurality of bit lines BL. The memory cell array 10 may include a plurality of memory cells. For example, the memory cell array 10 may be configured to store one or more bits in each cell.

The address decoder 20 may be connected to the memory cell array 10 via the word lines WL. The address decoder 20 operates according to the control of the control logic 50. The address decoder 20 may receive an address ADDR from the outside. The address decoder 20 decodes a row address among the received address ADDR to select a corresponding word line from among the word lines WL. Furthermore, the address decoder 20 decodes a column address among the address ADDR and transfers the decoded column address to the read/write circuit 30. For example, the address decoder 20 may include elements such as a row decoder, a column decoder, and address buffer.

The read/write circuit 30 may be connected to the memory cell array 10 via the bit line BL, and be connected to the data input/output circuit 40 via the data lines DL. The read/write circuit 30 may operate according to the control of the control logic 50. The read/write circuit 30 receives the decoded column address from the address decoder 20. The read/write circuit 30 selects a bit line BL using the decoded column address. For example, the read/write circuit 30 receives data from the data input/output circuit 40 and writes the received data in the memory cell array 10. The read/write circuit 30 reads data from the memory cell array 10 and transfers the read data to the data input/output circuit 40. The read/write circuit 30 reads data from a first storage region of the memory cell array 10, and writes the read data in a second storage region of the memory cell array 10. For example, the read/write circuit 30 may perform a copy-back operation.

The read/write circuit 30 may include elements which include a page buffer (or a page register) and a column selection circuit. In another example, the read/write circuit 30 may include elements which include a sensing amplifier, a write driver and a column selection circuit.

The data input/output circuit 40 may be connected to the read/write circuit 30 via the data lines DL. The data input/output circuit 40 operates according to the control of the control logic 50. The data input/output circuit 40 exchanges data DATA with the outside. The data input/output circuit 40 transfers the data DATA to the read/write circuit 30 via the data lines DL. The data input/output circuit 40 outputs the data DATA, which is transferred from the read/write circuit 30 through the data lines DL, to the outside. For example, the data input/output circuit 40 may include an element, such as a data buffer.

The control logic 50 may be connected to the address decoder 20, the read/write circuit 30 and the data input/output circuit 40. The control logic 50 controls the operation of a 3D semiconductor device. The control logic 50 may operate in response to a control signal CTRL transferred from the outside (e.g., external memory controller).

Figure 2:
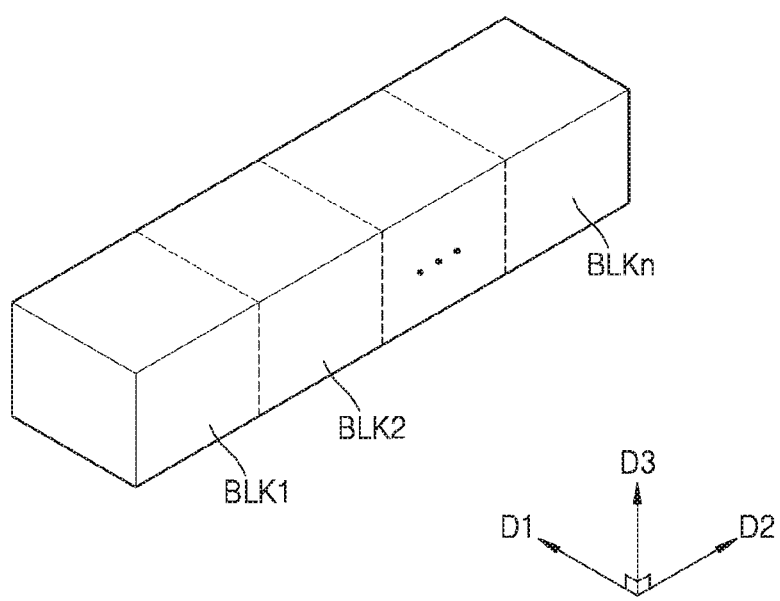
FIG. 2 is a block diagram showing an example of a memory cell array of FIG. 1.

FIG. 2 is a block diagram showing an example of a memory cell array of FIG. 1. Referring to FIG. 2, the memory cell array 10 may include a plurality of memory blocks BLK1 to BLKn. Each of the memory blocks BLK1 to BLKn may have a three-dimensional (3D) structure and/or a vertical structure. For example, the each of the memory blocks BLK1 to BLKn may include structures that are extended in first through third directions D1, D2, and D3 intersecting each other. For example, the each of the memory blocks BLK1 to BLKn includes a plurality of cell strings that are extended in the third direction D3.

Figure 3:
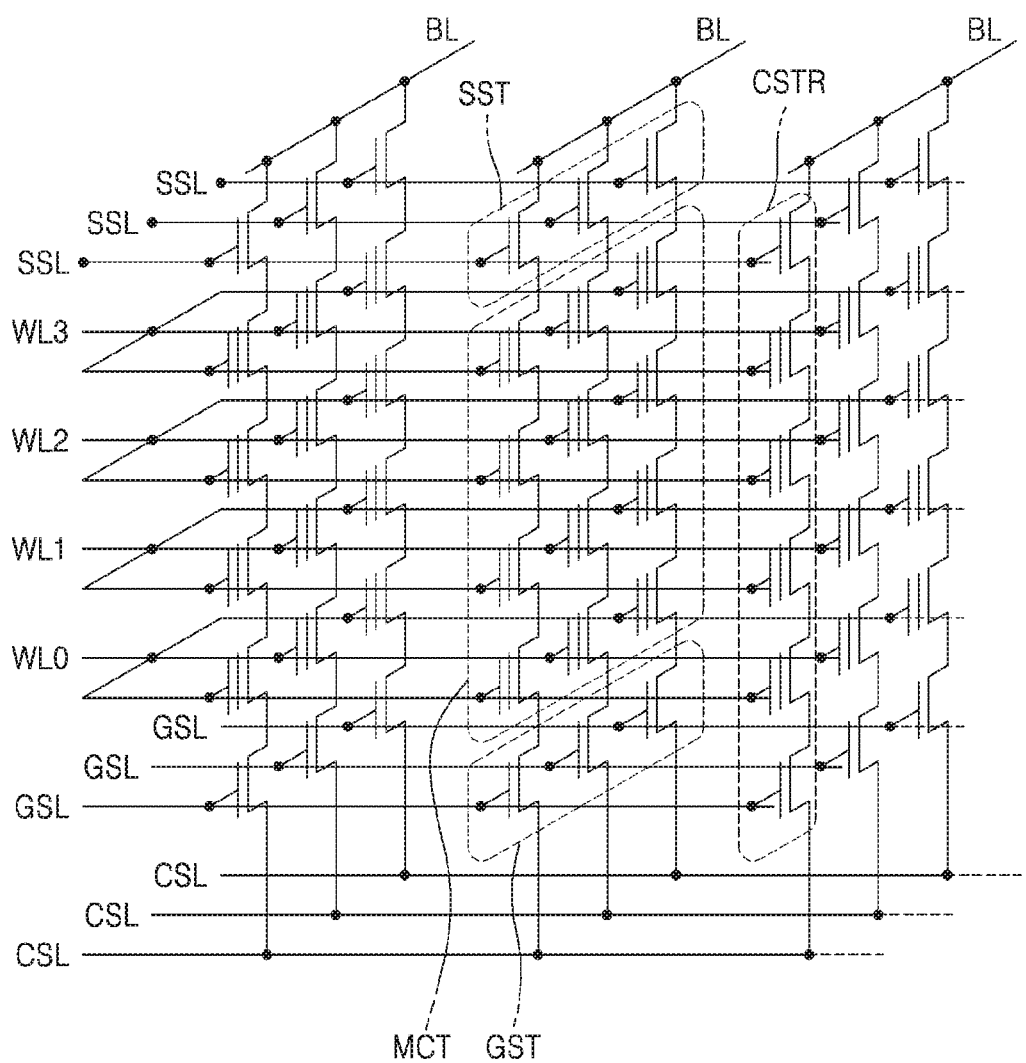
FIG. 3 is a circuit diagram schematically showing a cell array of a memory block of FIG. 2.
Figure 4:
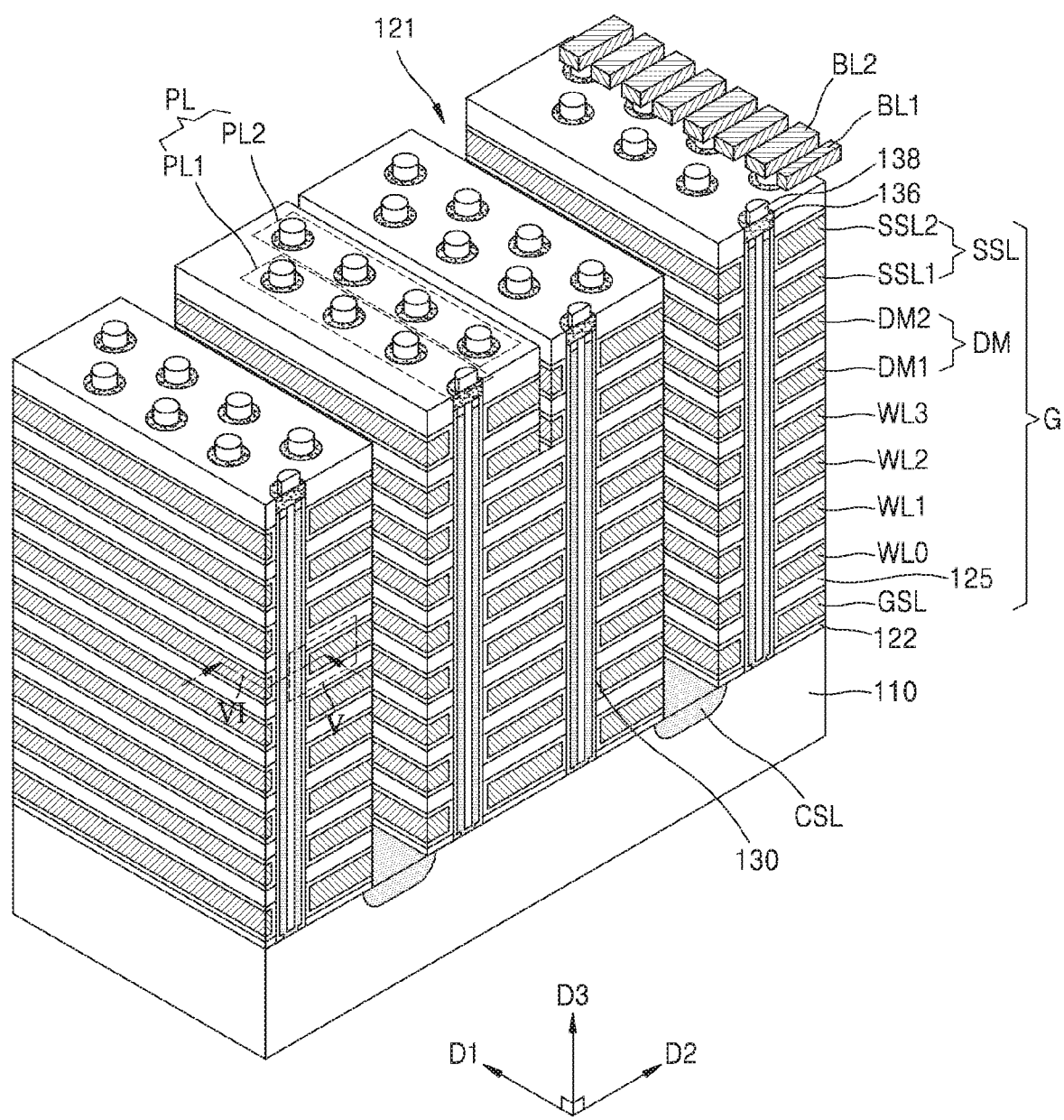
FIG. 4 is a perspective view showing a cell array of the three-dimensional semiconductor memory device.

FIG. 3 is a circuit diagram schematically showing a cell array of a memory block of FIG. 2. FIG. 4 is a perspective view showing a cell array of the 3-dimensional semiconductor memory device.

Referring to FIG. 3, a cell array of a 3-dimensional semiconductor memory device according to some example embodiments of inventive concepts includes a common source line CSL, a plurality of bit lines BL, and a plurality of cell strings CSTR arranged between the common source line CSL and the plurality of bit lines BL.

The plurality of bit lines BL are 2-dimensionally arranged, and the plurality of cell strings CSTR are respectively connected thereto in parallel. The plurality of cell strings CSTR may be connected to the common source line CSL in common. In other words, the plurality of cell strings CSTR may be arranged between a plurality of bit lines and one common source line CSL. Furthermore, a plurality of common source lines CSL may be 2-dimensionally arranged. Here, electrically same voltages may be applied to the plurality of common source lines CSL or each of the plurality of common source lines CSL may be electrically and independently controlled.

Each of the plurality of cell strings CSTR may include a ground select transistor GST connected to a common source line CSL, a string select transistor SST connected to a bit line BL, and a plurality of memory cell transistors MCT arranged between the ground select transistor GST and the string select transistor SST. Furthermore, the ground select transistor GST, the string select transistor SST, and the memory cell transistors MCT may be connected in series.

The common source line CSL may be connected to sources of ground select transistors GST in common. Furthermore, a ground select line GSL, a plurality of word lines WL0 through WL3, and a plurality of string select lines SSL that are disposed between the common source line CSL and the bit line BL may be respectively used as gate electrodes of the gate select transistor GST, the memory cell transistor MCT, and the string select transistor SST. Furthermore, each of the memory cell transistors MCTs includes data storage elements. FIG. 3 illustrates a non-limiting example where each cell string CSTR includes three word lines WL0 through WL3 between the string select line SSL and common source line CSL, but the number of word lines WL0 through WL3 per cell string CSTR may be increased or decreased.

Referring to FIG. 4, a substrate 110 is provided. The substrate 110 may have a first conductivity type, e.g., a P-type. A buffer dielectric film 122 may be provided on the substrate 110. The buffer dielectric film 122 may be a silicon oxide film including a middle temperature oxide (MTO), for example. Insulation patterns 125 and horizontal electrodes that are spaced apart from one another by interposing the insulation patterns 125 therebetween may be provided on the buffer dielectric film 122. The MTO may be formed using a low pressure chemical vapour deposition (LPCVD) under a temperature range of about 500° C. to about 800° C. and a pressure range of about 80 Pa about 120 Pa.

The horizontal electrodes may include the ground select line GSL, first through fourth word lines WL0 through WL3, and the string select lines SSL, and may be referred to as gate electrode structures. The insulation patterns 125 may be silicon oxide films. The buffer dielectric film 122 may be thinner than the insulation patterns 125. The horizontal electrodes may include doped silicon, a metal (e.g., tungsten), a metal nitride (e.g., titanium nitride), a metal silicide, or a combination thereof. The horizontal electrodes may include, for example, a barrier film and a metal film on the barrier film. The barrier film may include a metal nitride, e.g., titanium nitride. The metal film may include tungsten, for example.

The insulation patterns 125 and the horizontal electrodes may constitute a gate structure G. The gate structure G may extend horizontally along a first direction D1. A plurality of gate structures G may be provided on the substrate 110. The plurality of gate structures G may face each other along a second direction D2 intersecting the first direction D1. The string select lines SSL may be separated from one another along the second direction D2 and extend in the first direction D1. Although FIG. 4 shows that a plurality of string select lines SSL1 and SSL2 and one ground select line GSL are provided, inventive concepts are not limited thereto.

Between the gate structures G, isolating regions 121 extending along the first direction D1 may be provided. The common source lines CSL are provided on portions of the substrate 110 in the isolating regions 121. The common source lines CSL may be spaced apart from each other and extend along the first direction D1 in the substrate 110. The common source lines CSL may have a second conductivity type, e.g., an N-type, different from the first conductivity type. Unlike as shown in FIG. 4, the common source lines CSL may be a line-shaped pattern provided in the substrate 110 between two adjacent gate select lines GSL and extending along the first direction D1.

A plurality of cell pillars PL penetrate through the horizontal electrodes including the gate select lines GSL, the first through fourth word lines WL0 through WL3, and the string select lines SSL. The cell pillars PL may have a long axis extending vertically from the substrate 110 (e.g., extending along a third direction D3). First ends of the cell pillars PL may be connected to the substrate 110, and second ends thereof may be connected to wires extending along the second direction D2. The wires may include a first wire BL1 and a second wire BL2, which are adjacent to each other and extend along the second direction D2.

A plurality of cell pillars PL coupled to one string select line SSL may be arranged in a zig-zag shape or a staggered shape. The plurality of cell pillars PL may include first cell pillars PL1 and second cell pillars PL2 coupled to a same single string select line SSL. The first cell pillars PL1 are closest to the isolating region 121, whereas the second cell pillars PL2 are located farther from the isolating region 121. The second cell pillars PL2 are shifted from the first cell pillars PL1 along the first direction D1 and the second direction D2. The first cell pillars PL1 and the second cell pillars PL2 may be connected to first upper wires BL1 and second upper wires BL2 through conductive patterns 136 and contacts 138, respectively.

A plurality of cell strings are provided between the first and second upper wires BL1 and BL2 and common source lines CSL. The first and second upper wires BL1 and BL2 may be bit lines of a flash memory device. One cell string may include a string select transistor connected to the first and second upper wires BL1 and BL2, a ground select transistor connected to the common source lines CSL, and a plurality of vertical string memory cells provided between the string select transistor and the ground select transistor. The ground select line GSL may correspond to a ground select gate of the ground select transistor, the word lines WL0 through WL3 may correspond to cell gates of the plurality of vertical memory cells, and the string select line SSL may correspond to a string select gate of the string select transistor. A plurality of memory cells MC are provided at one cell pillar PL. The ground select gate may be a ground select gate of a flash memory device. The string select gate may be a string select gate of the flash memory device.

Between the first through fourth word lines WL0 through WL3 and cell pillars PL, a data storage element 130 may be provided. The data storage element 130 may be a charge storage film. For example, the data storage element 130 may be any one of a trapping insulation film, a floating gate electrode, or an insulation film including conductive nano dots. FIG. 4 shows that data storage elements 130 extends between insulation the insulation patterns 125 and the first through fourth word lines WL0 through WL3. Unlike as shown in FIG. 4, at least a portion of the data storage element 130 may extend between the insulation patterns 125 and the cell pillars PL. A gate insulation film may be provided between the string select lines SSL and the ground select lines GSL and the cell pillars PL instead of the data storage element 130.

A dielectric film may be disposed between the ground select lines GSL and the cell pillars PL or between string select lines SSL1 and SSL2 and the cell pillars PL. Here, the dielectric film may include a same material as the data storage element 130 or may be a gate insulation film (e.g., a silicon oxide film) for a common MOSFET.

In such a structure, the cell pillars PL, the ground select lines GSL, the first through fourth word lines WL0 through WL3, and the string select lines SSL1 and SSL2 may form a MOSFET using the cell pillars PL as channel regions. Alternatively, the cell pillars PL, the ground select lines GSL, the first through fourth word lines WL0 through WL3, and the string select lines SSL1 and SSL2 may form a MOS capacitor.

The ground select lines GSL, the first through fourth word lines WL0 through WL3, and the string select lines SSL1 and SSL2 may be used as gate electrodes of a select transistor and a cell transistor, respectively. Furthermore, inversion regions may be formed in the cell pillars PL by a fringe field from voltages applied to the ground select lines GSL, the first through fourth word lines WL0 through WL3, and string select lines SSL1 and SSL2. Here, a maximum length (or width) of an inversion region may be greater than a thickness of word lines or select lines that generate the inversion region. Therefore, the inversion regions formed in the cell pillars PL may vertically overlap and form a current path electrically connecting a selected bit line from the common source line CSL. In other words, the cell string CSTR may have a structure in which ground transistors and string transistors including the ground select lines GSL and the string select lines SSL1 and SSL2 and the memory cell transistors including the first through fourth word lines WL0 through WL3 are connected in series.

According to some example embodiments, dummy word lines DM1 and DM2 may be arranged between the string select lines SSL1 and SSL2 and the first through fourth word lines WL0 through WL3. The dummy word lines DM1 and DM2 may maintain the dispersion of threshold voltages in the string select lines SSL1 and SSL2 uniformly to limit and/or prevent reduction of a cell current.

Figure 5:
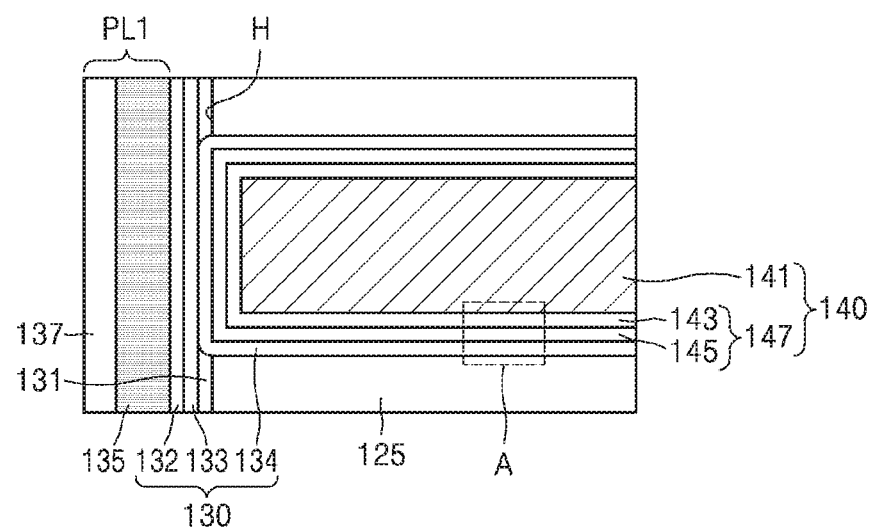
FIG. 5 is a magnified cross-sectional view of a portion V in FIG. 4.
Figure 6:
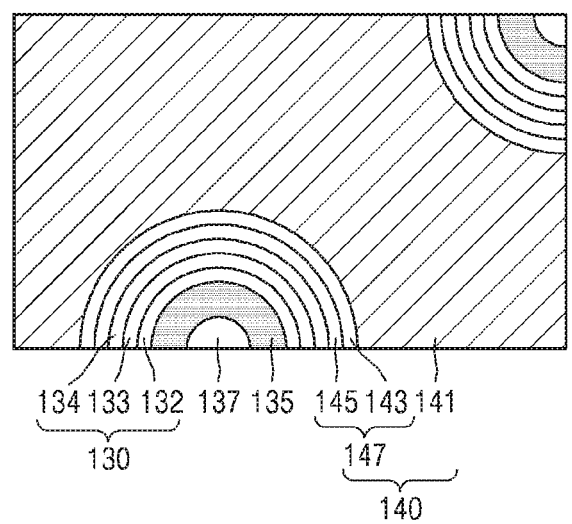
FIG. 6 is a cross-sectional view of a portion VI in FIG. 4.

FIG. 5 is a magnified cross-sectional view of a portion V in FIG. 4. FIG. 6 is a cross-sectional view of a portion VI in FIG. 4.

Referring to FIGS. 5 and 6, a gate electrode structure 140 includes a metal gate 141, a barrier film 145, and a crystal grain boundary plugging layer 143 interposed between the metal gate 141 and the barrier film 145. One surface of the gate electrode structure 140 may be configured to contact the data storage element 130 and may be used to perform read and write operations through electrical interaction.

The metal gate 141 may include a metal, such as tungsten (W), aluminum (Al), copper (Cu), titanium (Ti), tantalum (Ta), platinum (Pt), or a combination thereof. The metal gate 141 may be provided via, for example, atomic layer deposition (ALD), chemical vapor deposition (CVD), or physical vapor deposition (PVD), but inventive concepts are not limited to these methods.

A metal nitride layer 147 may be provided on a surface of the metal gate 141. Here, the metal nitride is not only defined as a compound of a metal and nitrogen, but also as a metal-nitrogen compound further including a different element, such as oxygen and/or silicon.

The metal nitride layer 147 may include the barrier film 145 and the crystal grain boundary plugging layer 143. The crystal grain boundary plugging layer 143 may be interposed between the metal gate 141 and the barrier film 145. The crystal grain boundary plugging layer 143 and the barrier film 145 may be arranged on surfaces of the metal gate 141 in a substantially conformal manner. The crystal grain boundary plugging layer 143 and the barrier film 145 may each have a thickness from about 2 angstroms to about 20 angstroms.

The barrier film 145 is a part of the metal nitride layer 147 and may include crystal grains of a metal nitride. The barrier film 145 may include one or more materials selected from among titanium nitride (TiN), tantalum nitride (TaN), tungsten nitride (WN), molybdenum nitride (MoN), niobium nitride (NbN), titanium oxynitride (TiON), tungsten silicon nitride (WSiN), molybdenum silicon nitride (MoSiN), tantalum silicon nitride (TaSiN), and titanium silicon nitride (TiSiN).

The crystal grain boundary plugging layer 143 is a part of the metal nitride layer 147, includes crystal grains of metal nitride, and may include oxygen at the interfaces between crystal grains of the metal nitride. The oxygen may be present in the form of atoms, molecules, ions, radicals, or a metal oxide. According to some example embodiments, the crystal grain boundary plugging layer 143 may further include nitrogen at the interfaces between the crystal grains of the metal nitride.

The existence of oxygen (or oxygen and nitrogen) at the interface between the crystal grains of the metal nitride of the crystal grain boundary plugging layer 143 may be observed and confirmed via atomic probe tomography (APT). Since the APT is a well-known analytical method to one of ordinary skills in the art, detailed description thereof will be omitted.

Figure 7:
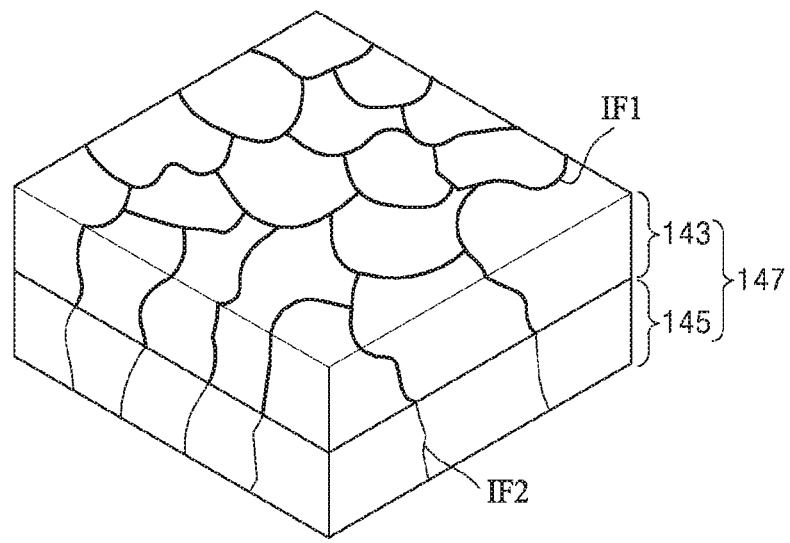
FIG. 7 is a perspective view of a portion indicated as A in FIG. 5, in which a metal gate is omitted, according to some example embodiments of inventive concepts.

FIG. 7 is a perspective view of the portion indicated as A in FIG. 5 in which the metal gate 141 is omitted, according to some example embodiments of inventive concepts.

Referring to FIG. 7, it may be seen that a plurality of crystal grains are in contact with one another across the interfaces therebetween in the crystal grain boundary plugging layer 143 and the barrier film 145. The crystal grains of the crystal grain boundary plugging layer 143 may be in contact with one another across first interfaces IF1 containing oxygen. The crystal grains of the barrier film 145 may be in contact with one another across a second interface IF2 that does not contain oxygen. According to some example embodiments, the first interface IF1 may further include nitrogen.

Although FIG. 7 shows that all of the interfaces of the crystal grain boundary plugging layer 143 constitute the first interfaces IF1 containing oxygen, even interfaces between the crystal grains belonging to the crystal grain boundary plugging layer 143 may not contain oxygen partially.

According to some example embodiments, at least one of the metal nitride crystal grains of the metal nitride layer 147 may be located across the barrier film 145 and the crystal grain boundary plugging layer 143. In particular, according to some example embodiments, at least one of the metal nitride crystal grains of the metal nitride layer 147 may be located over the overall thickness of the barrier film 145 and the crystal grain boundary plugging layer 143.

Figure 8:
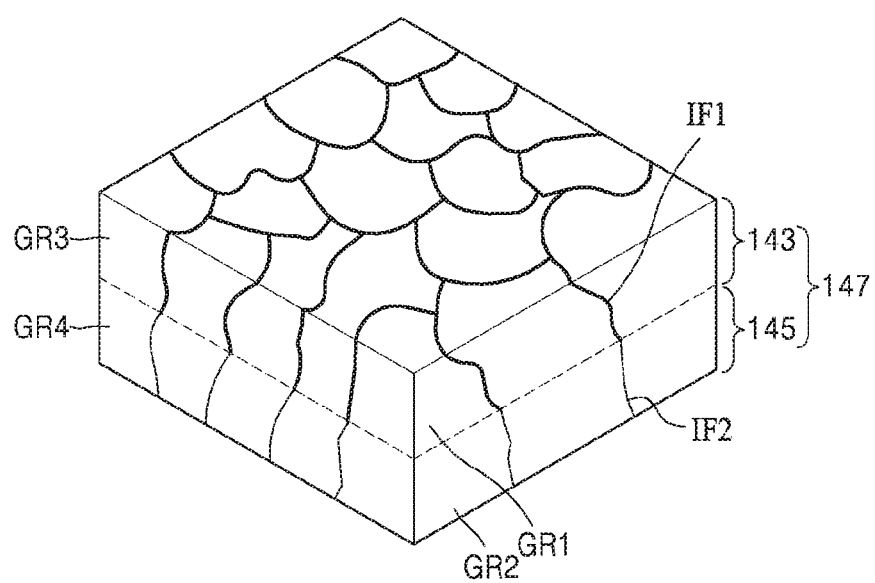
FIG. 8 is a perspective view of the portion indicated as A in FIG. 5, in which a metal gate omitted, according to some example embodiments of inventive concepts.

FIG. 8 is a perspective view of the portion indicated as A in FIG. 5 according to some example embodiments of inventive concepts with the metal gate 141 omitted.

The embodiment of FIG. 8 differs from the embodiment of FIG. 7 in that crystal grains belonging to the crystal grain boundary plugging layer 143 may be integrated with crystal grains belonging to the barrier film 145.

As shown in FIG. 8, the crystal grains of the crystal grain boundary plugging layer 143 may extend in a column-like shape (along a vertical direction in FIG. 8) and be integrated with the crystal grains of the barrier film 145. More specifically, a crystal grain portion GR1 of the crystal grain boundary plugging layer 143 may constitute a single crystal with a crystal grain portion GR2 of the barrier film 145. Similarly, a crystal grain portion GR3 of the crystal grain boundary plugging layer 143 may constitute a single crystal with a crystal grain portion GR4 of the barrier film 145.

In such a case, one crystal grain, e.g., the crystal grain portions GR1 and GR2 or GR3 and GR4, may exist throughout the overall thickness of the crystal grain boundary plugging layer 143 and the barrier film 145.

According to some example embodiments, the first interface IF1 in which oxygen is present along one side surface of one crystal grain (e.g., the crystal grain portions GR1 and GR2 or GR3 and GR4) and the second interface IF2 in which no oxygen is present may be have a continuous form. Furthermore, the crystal grain boundary plugging layer 143 and the barrier film 145 may be distinguished from each other around a virtual boundary (the dotted line portion in FIG. 8) between the first interface IF1 and the second interface IF2.

Figure 9:
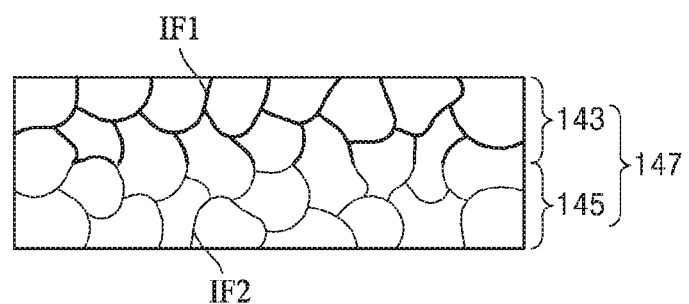
FIG. 9 is a cross-sectional lateral view of a portion of a metal nitride layer of the portion indicated as A in FIG. 5, according to some example embodiments of inventive concepts.

FIG. 9 is a cross-sectional lateral view of a portion of the metal nitride layer 147 of the portion shown as A in FIG. 5 according to some example embodiments of inventive concepts.

Referring to FIG. 9, there may be no one crystal grain existing throughout the overall thickness of the crystal grain boundary plugging layer 143 and the barrier film 145. As shown in FIG. 9, a plurality of crystal grains may be arranged not only in horizontal directions, but also in vertical directions around the interfaces.

At this time, some of the plurality of crystal grains may be entirely located within the crystal grain boundary plugging layer 143. Some other of the plurality of crystal grains may be entirely located within the barrier film 145. Some other of the plurality of crystal grains may be located across the barrier film 145 and the crystal grain boundary plugging layer 143.

In the crystal grain boundary plugging layer 143, the interfaces between the plurality of crystal grains may be the first interfaces IF1, in which oxygen exists. In the barrier film 145, the interfaces between the plurality of crystal grains may be the second interfaces IF2, in which oxygen does not exist. As shown in FIG. 9, in the crystal grains existing over the boundary between the crystal grain boundary plugging layer 143 and the barrier film 145, some of surfaces thereof may belong to the first interfaces IF1, and some other thereof may belong to the second interfaces IF2. As described above, the first interfaces IF1 may further include nitrogen.

Content of halogen atoms in the crystal grain boundary plugging layer 143 may be lower than content of halogen atoms in the barrier film 145. The halogen atoms may be, for example, fluorine (F), chlorine (Cl), bromine (Br), or iodine (I). Since halogen atoms in the metal nitride layer 147 may cause non-uniform nucleation during formation of the metal gate 141, halogen atoms may be at least partially removed from a surface on which the metal gate 141 is to be disposed before the metal gate 141 is disposed thereon. According to some example embodiments, the crystal grain boundary plugging layer 143 may be substantially free of halogen atoms.

FIGS. 10A through 10H are cross-sectional lateral view diagrams sequentially showing a method of manufacturing a semiconductor memory device according to some example embodiments of inventive concepts.

Figure 10A:
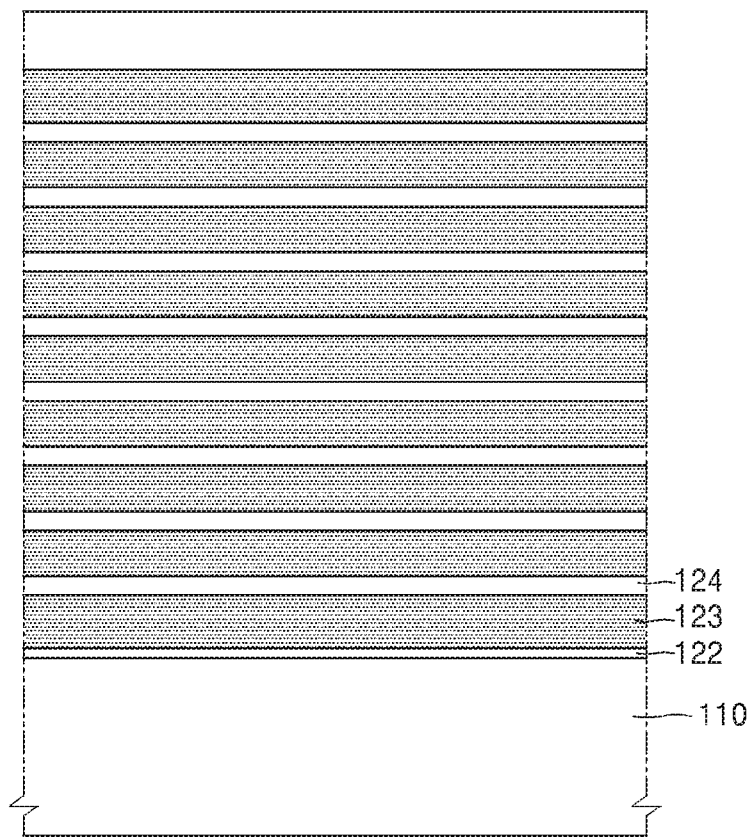
FIGS. 10A through 10H are cross-sectional lateral view diagrams sequentially showing a method of manufacturing a semiconductor memory device, according to some example embodiments of inventive concepts.

Referring to FIG. 10A, the substrate 110 is provided. The substrate 110 may include Si, Ge, or SiGe. According to some example embodiments, the substrate 110 may include a silicon-on-insulator (SOI) substrate or a germanium-on-insulator (GeOI) substrate. The substrate 110 may have a first conductivity type, e.g., a P-type conductivity type.

The buffer dielectric film 122 may be disposed on the substrate 110. The buffer dielectric film 122 may be, for example, a silicon oxide film. The buffer dielectric film 122 may be disposed via a thermal oxidation process. According to some example embodiments, the buffer dielectric film 122 may include a middle temperature oxide (MTO).

The sacrificial film 123 for forming the ground select line GSL may be provided on the buffer dielectric film 122. The sacrificial film 123 may include a material having different wet-etching characteristics with respect to the buffer dielectric film 122 and the insulation films 124. The sacrificial film 123 may include, for example, a silicon nitride film, a silicon oxynitride film, a polysilicon film, or a polysilicon germanium film. The sacrificial film 123 may be disposed by using a chemical vapor deposition (CVD) method, for example.

The sacrificial films 123 and the insulation films 124 are alternately stacked on the buffer dielectric film 122. The thickness of the insulation film 124 of the top layer may be thicker than the thickness of the other insulation films 124. The insulation films 124 may be, for example, silicon oxide films. The sacrificial films 123 may include a material having different wet-etching characteristics with respect to the buffer dielectric film 122 and the insulation films 124. The sacrificial films 123 may include, for example, a silicon nitride film, a silicon oxynitride film, a polysilicon film, or a polysilicon germanium film. The sacrificial films 123 and the insulation films 124 may be formed by using a chemical vapor deposition (CVD) method, for example.

Figure 10B:
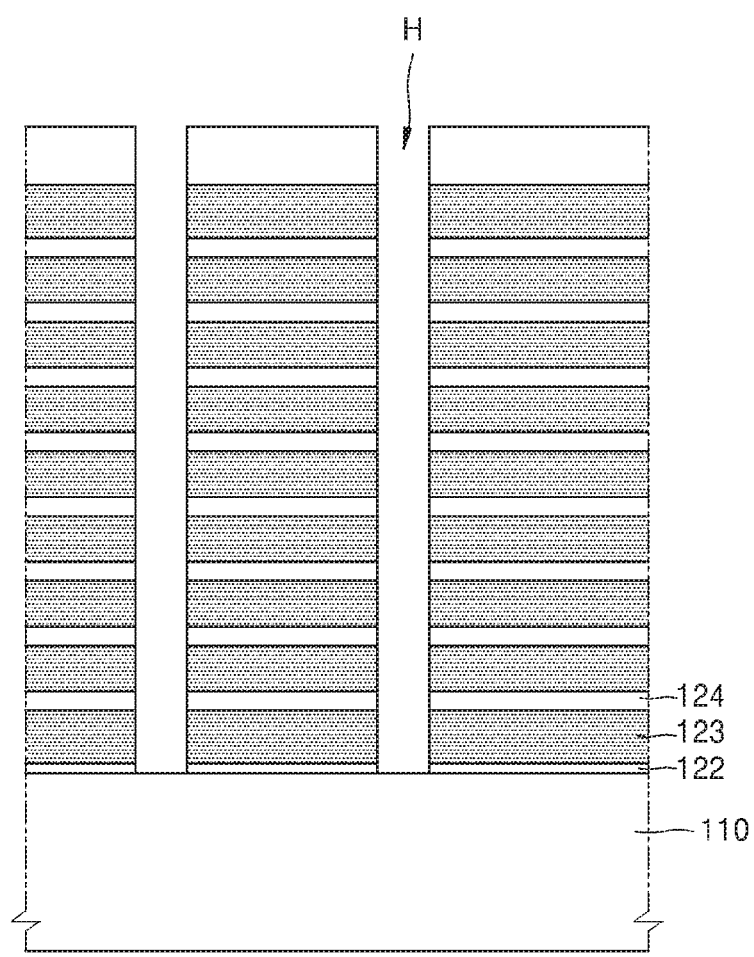

Referring to FIG. 10B, cell holes H that penetrate through the buffer dielectric film 122, sacrificial films 123, and insulation films 124 and expose substrate 110 are formed. The cell holes H may be formed via, for example, a photolithography process.

Figure 10C:
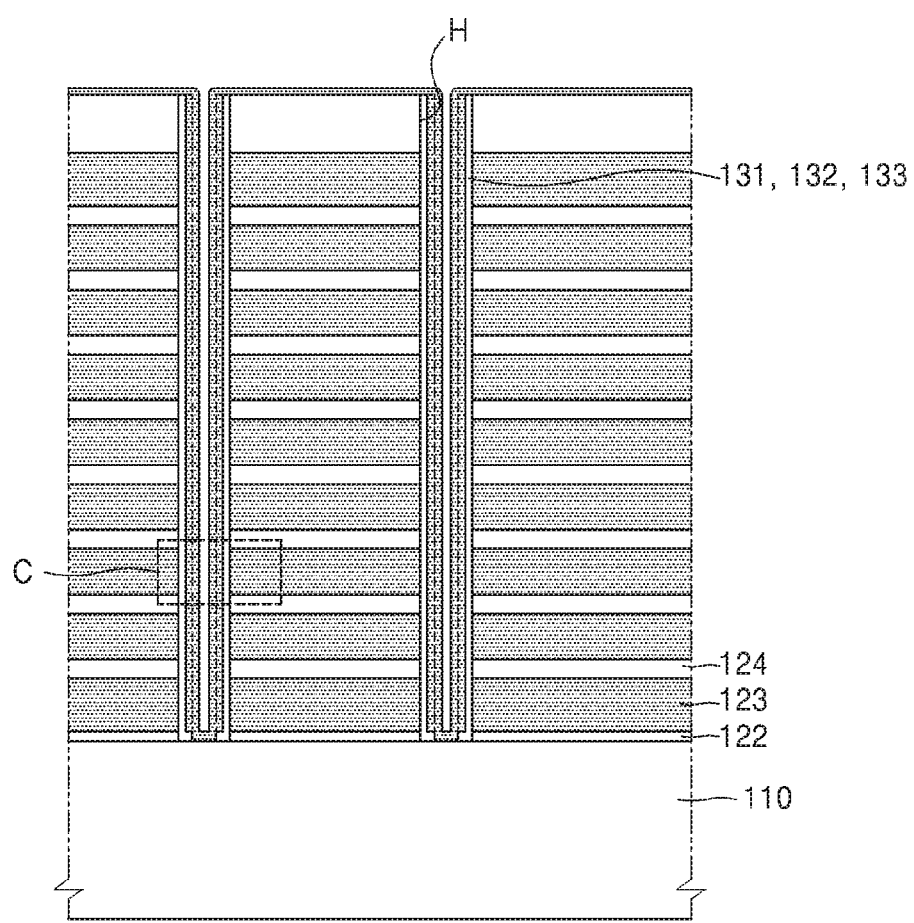
Figure 10D:
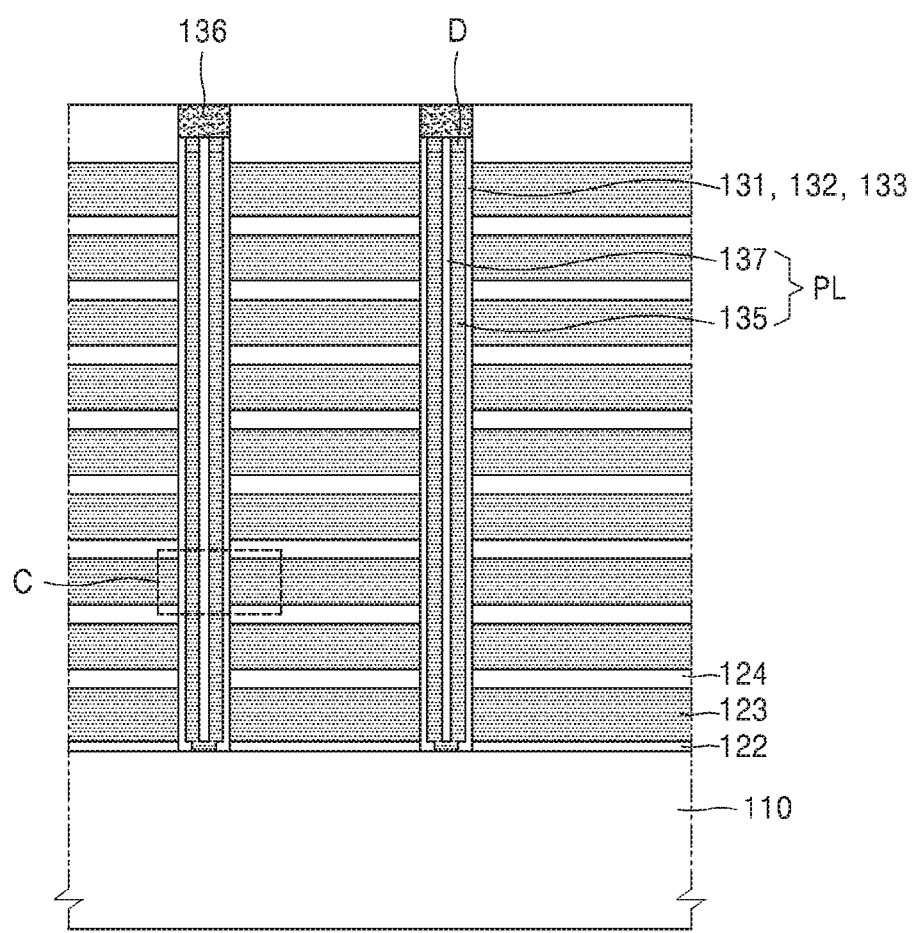

Referring to FIGS. 10C and 10D, cell pillars PL are formed in the cell holes H. In order to describe a process for forming the cell pillars PL in detail, a portion C of FIG. 10C is shown in FIG. 11, and a portion C of FIG. 10D is shown in FIG. 12.

Figure 11:
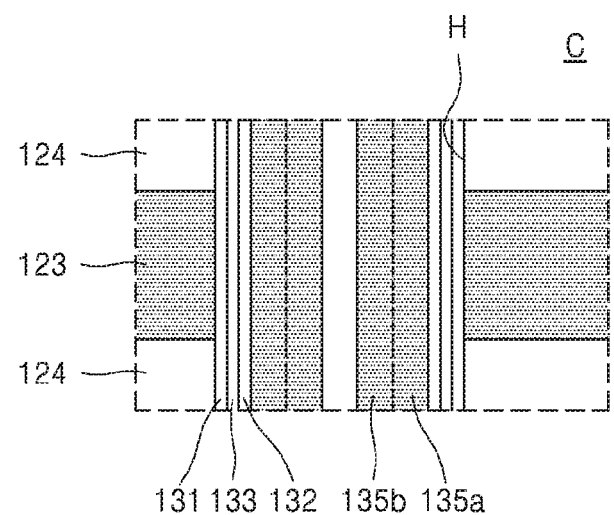
FIG. 11 is a partial cross-sectional view of a portion C of FIG. 10C.

Referring to FIGS. 10D and 11, a protective film 131 is disposed on the sidewalls of the cell holes H. The protective film 131 may be a silicon oxide film. A charge storage film 133 is disposed on the protective film 131. The charge storage film 133 may be a charge trapping film or an insulation film including conductive nanoparticles. The charge trapping film may include, for example, a silicon nitride film. A tunnelling insulation film 132 is disposed on the charge storage film 133. The tunnelling insulation film 132 may be a silicon oxide film. The protective film 131, the tunnelling insulation film 132, and the charge storage film 133 may be disposed by using an ALD or CVD method.

A first sub-semiconductor film 135a may be disposed on the tunnelling insulation film 132. The first sub-semiconductor film 135a is anisotropically etched to expose the substrate 110. The first sub-semiconductor film 135a may be changed to a spacer film remaining only on the sidewalls of the tunnelling insulation film 132. A second sub-semiconductor film 135b may be disposed on the first sub-semiconductor film 135a. The second sub-semiconductor film 135b is in contact with the substrate 110. The first and second sub-semiconductor films 135a and 135b may be disposed by using an ALD or CVD method. The first and second sub-semiconductor films 135a and 135b may be amorphous silicon films.

Figure 12:
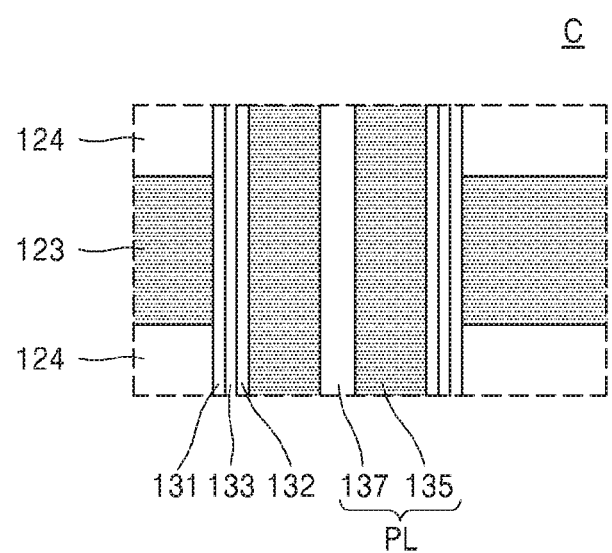
FIG. 12 is a partial cross-sectional view of the portion C of FIG. 10D.

Referring to FIGS. 10D and 12, a heat treatment process may be performed so that the first and second sub-semiconductor films 135a and 135b may be changed to a semiconductor film 135. The semiconductor film 135 may be a polysilicon film or a crystalline silicon film.

The semiconductor film 135 is disposed so as not to completely fill the cell holes H, and an insulating material may be formed on the semiconductor film 135 to completely fill the cell holes H. The semiconductor film 135 and the insulating material may be planarized to expose the insulation film of the top layer. Therefore, cylindrical semiconductor pillars PL of which the inner space is filled with a filling insulation film 137 may be formed. The cylindrical semiconductor pillars PL may be a semiconductor film having a first conductivity type. Alternatively, the semiconductor film 135 may be formed to fill the cell holes H, unlike as shown in FIG. 12. In this case, a filling insulation film may be omitted.

The upper portions of the cell pillars PL may be recessed to be lower than the insulation film of the top layer. The conductive patterns 136 may be formed in the cell holes H where the cell pillars PL are recessed. The conductive patterns 136 may include doped polysilicon or a metal. Drain regions D may be formed by implanting impurity ions of a second conductivity type into the conductive patterns 136 and the upper portions of the cell pillars PL. The second conductivity type may be, for example, N-type.

Figure 10E:
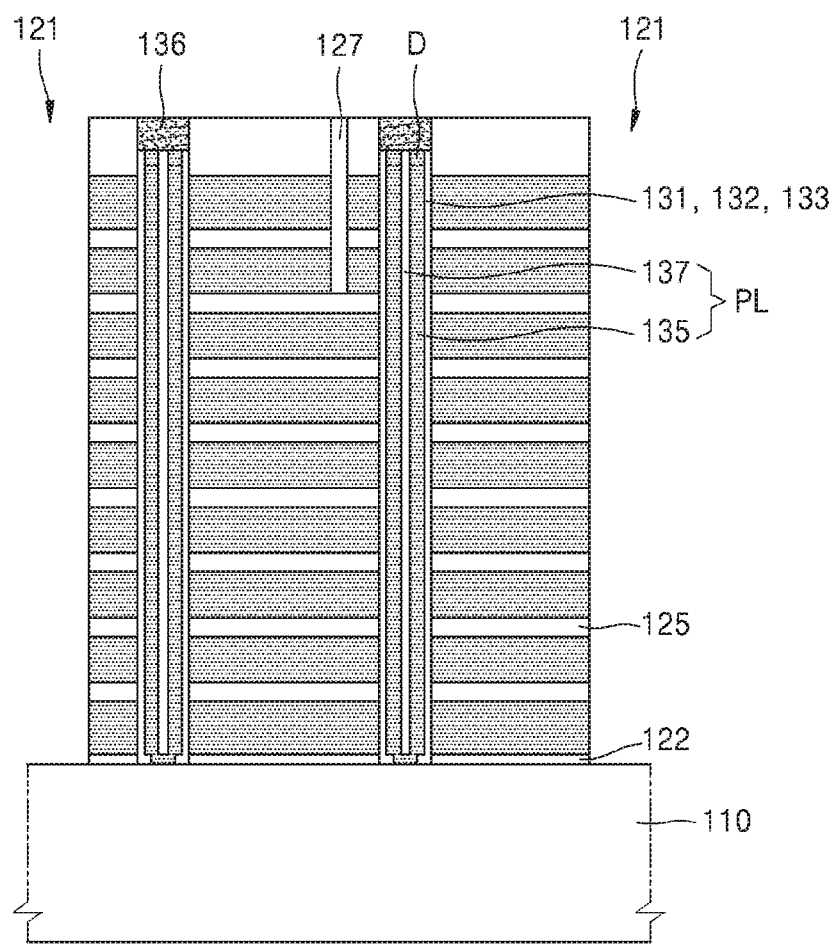

Referring to FIG. 10E, the buffer dielectric film 122, the sacrificial films 123, and the insulation films 124 are consecutively patterned, thereby forming isolating regions 121 that are apart from one another, extend in a first direction, and expose the substrate 110. The patterned insulation films 124 become the insulation patterns 125. As a result, the sacrificial films at locations where the ground select line GSL is to be formed later may be separated from each other.

In the meantime, an insulation film and a sacrificial film at the top layer between the isolating regions 121 may be patterned to form an opening 127. The opening 127 extends along the first direction D1 between the isolating regions 121 and divides the sacrificial film of the top layer into two. The opening 127 may be filled with an insulation material (e.g., a silicon oxide film) to form an insulation film 127'.

Figure 10F:
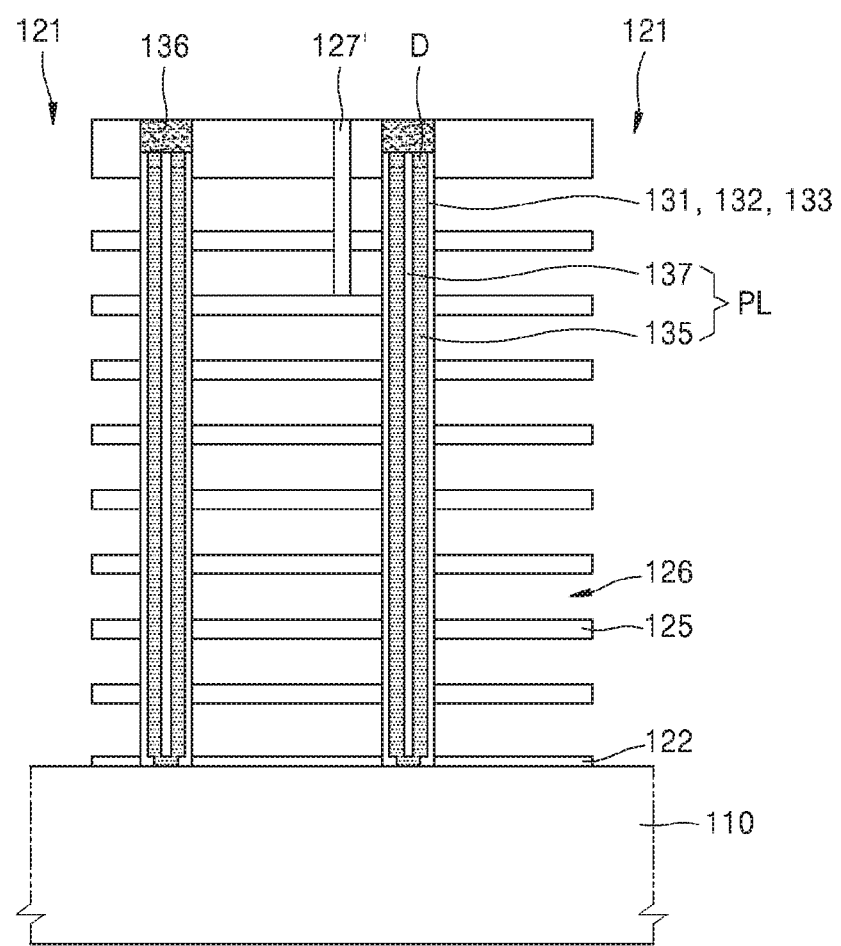

Referring to FIG. 10F, the sacrificial films 123 exposed in the isolating regions 121 are selectively removed to form recessed regions 126. The recessed regions 126 correspond to regions where the sacrificial films 123 are removed and are defined by the cell pillars PL and the insulation patterns 125. When the sacrificial films 123 include silicon nitride films or silicon oxynitride films, a process for removing the sacrificial films may be performed by using an etching solution including phosphoric acid. The recessed regions 126 expose portions of the sidewalls of the cell pillars PL.

The protective film 131 may limit and/or prevent the charge storage film 133 from being damaged by an etching solution for removing the sacrificial films 123. The protective film 131 exposed by the recessed region 126 may be selectively removed. When the protective film 131 is a silicon oxide film, the protective film 131 may be removed by an etching solution containing hydrofluoric acid, for example. Therefore, the recessed region 126 may expose a portion of the charge storage film 133.

The overall height of the stack of sacrificial films 123 and insulation films 124 may be reduced to facilitate formation of the cell holes H described above. Therefore, the aspect ratio of the cell holes H may be reduced to facilitate etching of the stack of the sacrificial films 123 and the insulation films 124. To reduce the overall height of the stack without changing the number of the stack, an approach includes reducing the thickness of the sacrificial films 123 and/or the thickness of the insulation films 124.

Figure 10G:
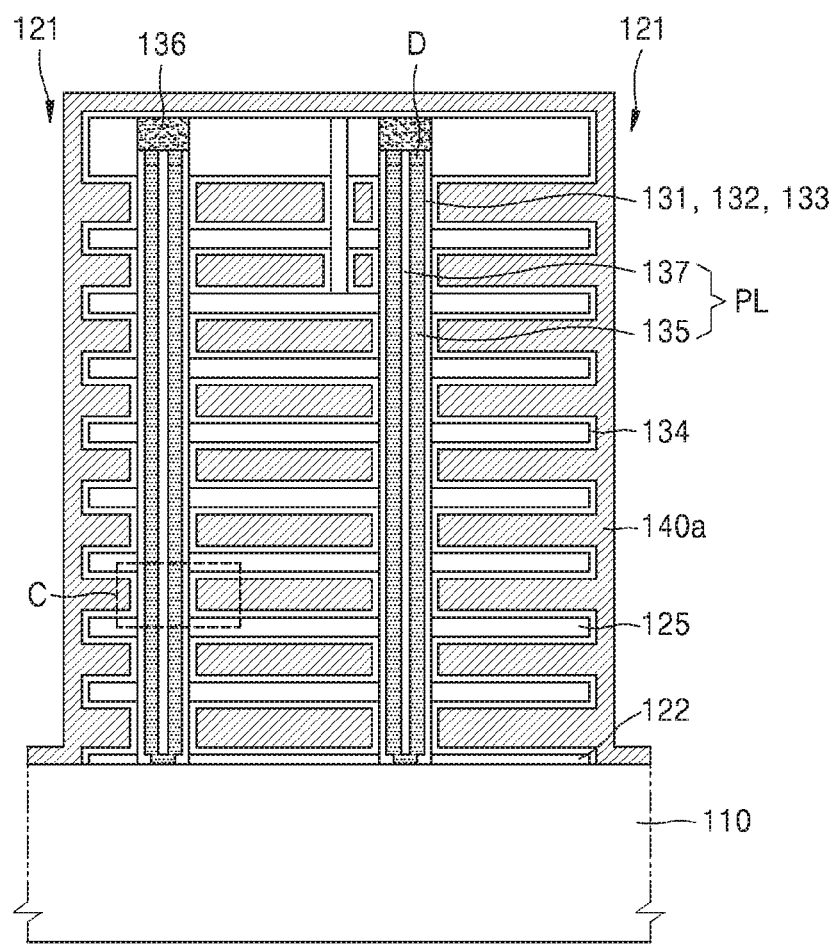

Referring to FIG. 10G, a blocking insulation film 134 may be disposed in the recessed region 126. The blocking insulation film 134 may be conformally disposed on the top and bottom surfaces of the insulation patterns 125 exposed in the recessed region 126 and on the charge storage film 133. The blocking insulation film 134 may include a high-k film (e.g., an aluminum oxide film or a hafnium oxide film). The blocking insulation film 134 may be a multilayered film including a plurality of thin-films. For example, the blocking insulation film 134 may include aluminum oxide films and silicon oxide films, and the order of stacking the aluminum oxide films and the silicon oxide films may vary. The blocking insulation film 134 may be disposed via an atomic layer deposition process and/or a chemical vapor deposition process with excellent step coverage.

Next, a conductive film 140a is disposed on the blocking insulation film 134. The conductive film 140a may include at least one of a metal film, a metal nitride film, and a metal silicide film. The conductive film 140a may be disposed by using a CVD or an ALD method. For example, the conductive film 140a may include a barrier film, a crystal grain boundary plugging layer on the barrier film, and a conductive film on the crystal grain boundary plugging layer. The barrier film and the crystal grain boundary plugging layer may be metal nitride films (e.g., titanium nitride films). The metal film may include a metal, such as tungsten (W), aluminum (Al), copper (Cu), titanium (Ti), tantalum (Ta), and platinum (Pt).

Figure 13A:
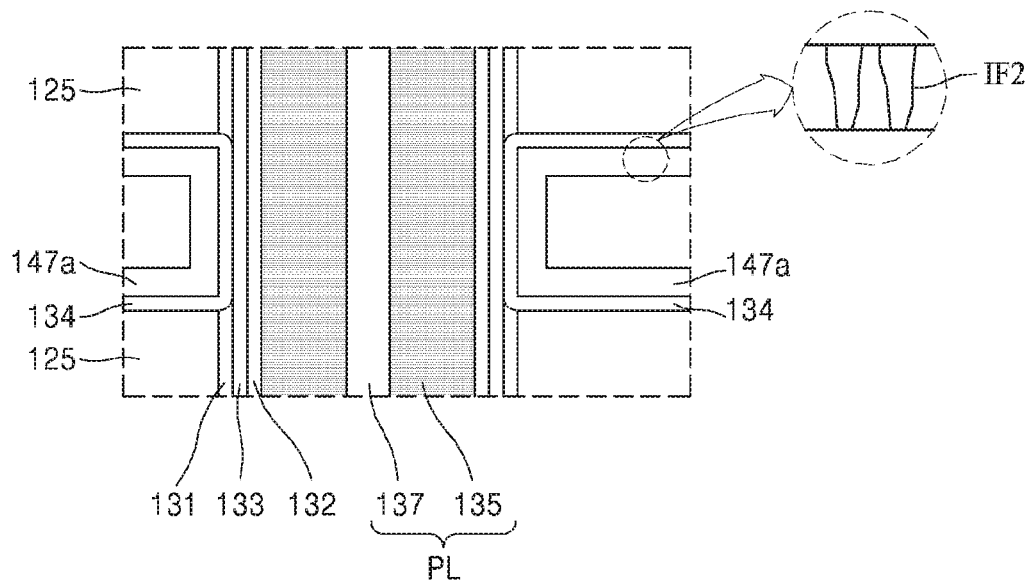
FIGS. 13A to 13C are partial cross-sectional view diagrams for describing a method of disposing a conductive film 140a in detail, and may correspond to a portion C of FIG. 10G.
Figure 13B:
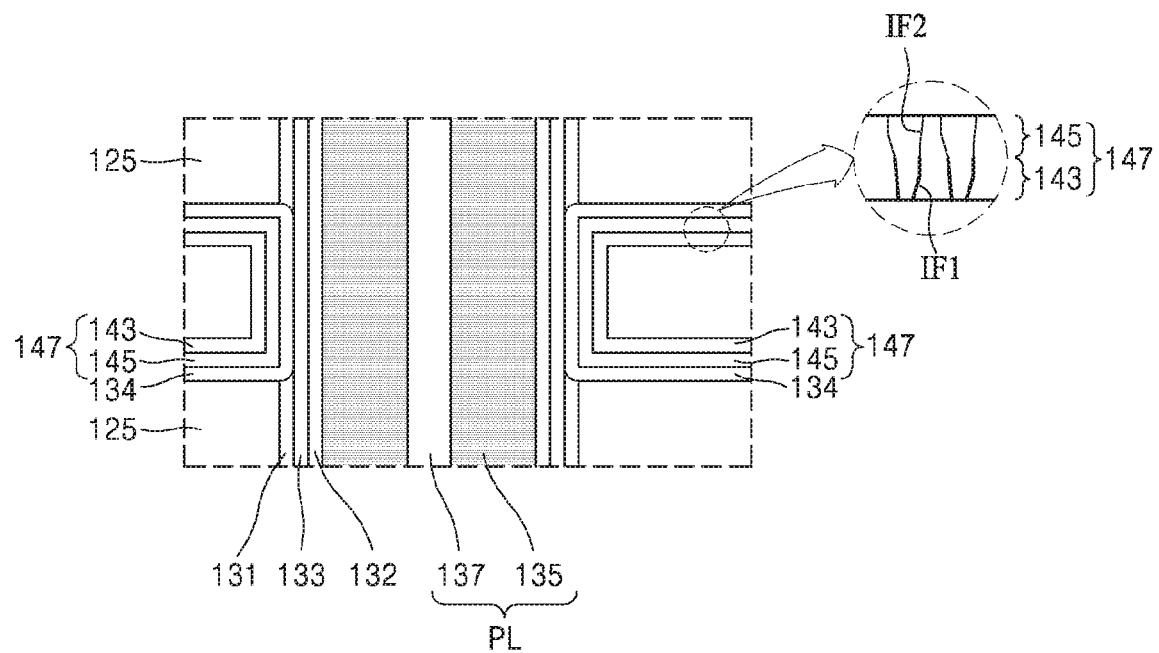
Figure 13C:
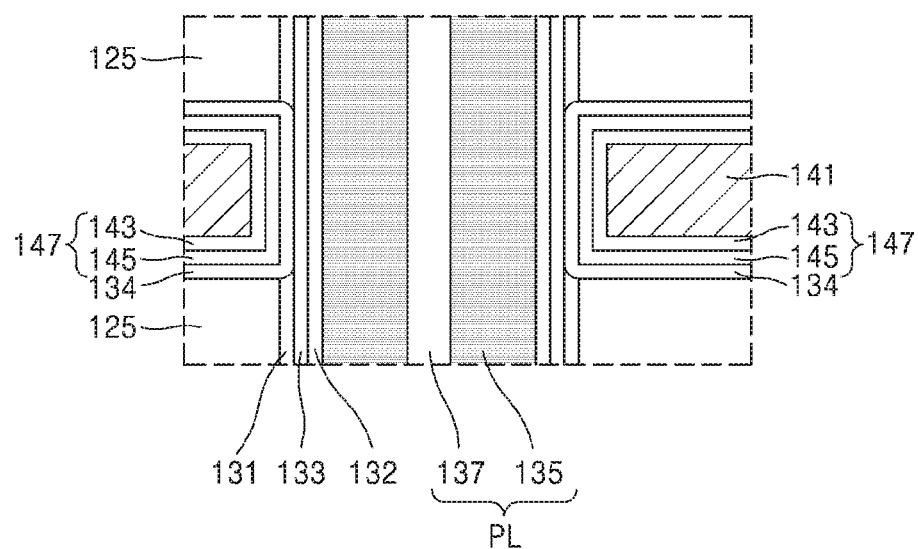
Figure 16:
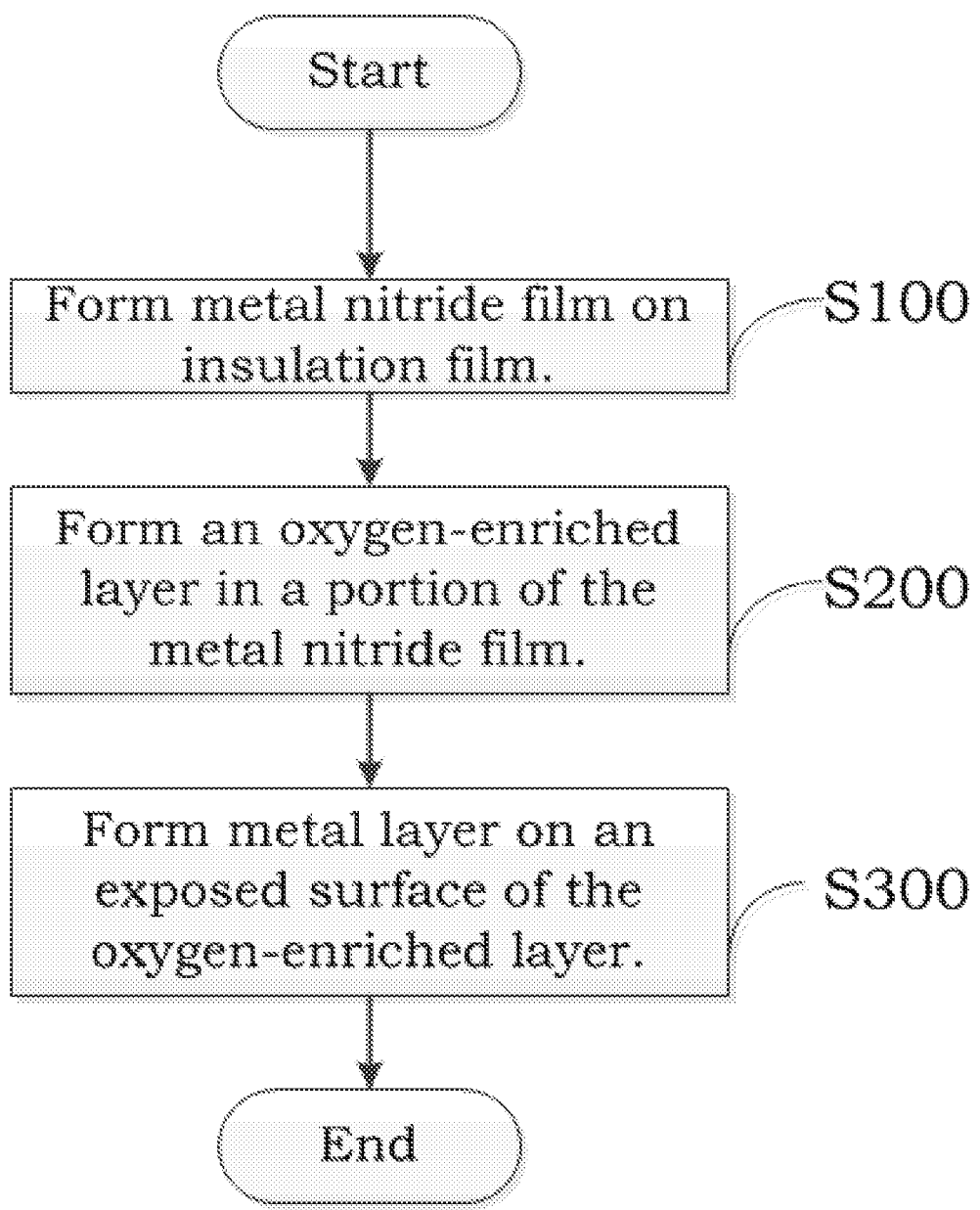
FIG. 16 is a flow chart for a method of forming a conductive film.

FIGS. 13A to 13C are partial cross-sectional view diagrams for describing a method of disposing the conductive film 140a in detail and may correspond to the portion C of FIG. 10G. FIG. 16 is a flow chart for a method of forming a conductive film.

Referring to FIG. 13A and operation S100 in FIG. 16, a metal nitride film 147a is disposed on the blocking insulation film 134. The metal nitride film 147a may include at least one of titanium nitride (TiN), tantalum nitride (TaN), tungsten nitride (WN), molybdenum nitride (MoN), niobium nitride (NbN), titanium oxynitride (WSiN), tungsten silicon nitride (WSiN), molybdenum silicon nitride (MoSiN), tantalum silicon nitride (TaSiN), or titanium silicon nitride (TiSiN), for example.

The thickness of the metal nitride film 147a may be from about 4 angstroms to about 20 angstroms, but is not limited thereto. The metal nitride film 147a may be disposed by using a method, such as ALD or CVD. A metal precursor used to dispose the metal nitride film 147a may include halogen atoms. In the metal nitride film 147a disposed as shown in FIG. 13A, unreacted halogen atoms or halogen atoms that are not completely removed may be included.

The metal nitride film 147a may have a polycrystalline crystal grain structure and may have a column-like crystal grain structure as shown in the circle of FIG. 13A. However, inventive concepts are not limited thereto, and the metal nitride film 147a may have a finer crystal grain structure.

Referring to FIG. 13B and operation S200 in FIG. 16, an oxygen-enriched layer may be formed in a portion of the metal nitride film 147a. An exposed surface of the metal nitride film 147a may be oxidized by using a liquid oxidizing agent. The oxidizing agent for oxidization may include one or more of $O_3$, $H_2O$, $O_2$, $NO_2$, NO, $N_2O$, alcohol, and metal alkoxide in the liquid state. Particularly, at least one of $O_3$, $H_2O$, $O_2$, $NO_2$, NO, or $N_2O$ dissolved in deionized water may be used as the liquid oxidizing agent. Alternatively, deionized water may be used alone as the liquid oxidizing agent.

The exposed surface of the metal nitride film 147a may have a complicated feature, e.g., a hole pattern with a high aspect ratio, and a bottom surface, a top surface, and a side wall of a recessed portion extending laterally from the hole pattern. Such a complicated exposed surface of the metal nitride film 147a may be uniformly oxidized substantially in a position-independent manner by contacting with the liquid oxidizing agent. Furthermore, it is sufficient to bring the exposed surface of the metal nitride film 147a in contact with an oxidizing agent at a mild temperature, e.g., a temperature from about 10° C. to about 50° C., for a certain time period, and thus the manufacturing cost may be reduced.

When the exposed surface of the metal nitride film 147a is oxidized as described above, as shown in the circle of FIG. 13B, oxygen may be included at the interfaces between crystal grains of the metal nitride film 147a. Oxygen may be included throughout the entire interface length between the crystal grains of the metal nitride film 147a, or oxygen may be included only in a portion of the interface length. A layer corresponding to a thickness to which oxygen may penetrate may be referred to as an oxygen-enriched layer. Such an oxygen-enriched layer may coincide with the crystal grain boundary plugging layer 143 described above with reference to FIGS. 7 through 9.

When oxygen is contained only in a part of the interface length between the crystal grains of the metal nitride film 147a (as shown in the circle in FIG. 13B), a portion of the metal nitride film 147a corresponding to the thickness up to oxygen penetration may function as the crystal grain boundary plugging layer 143, whereas a portion of the metal nitride film 147a without oxygen may function as the barrier film 145. In this case, crystal grains in the crystal grain boundary plugging layer 143 may be adjacent to one another across the first interface IF1 containing oxygen, whereas crystal grains in the barrier film 145 may be adjacent to one another across the interface IF2 containing no oxygen. The first interface IF1 may further include nitrogen.

As the crystal grain boundary plugging layer 143 is disposed, a concentration of the halogen atoms in the first interface IF1 may be remarkably reduced. Therefore, when the metal gate 141 (see FIG. 13C) is disposed later, uniformity of nucleation is significantly improved, and thus the reliable metal gate 141 with high reliability may be obtained.

Referring to operation S300 in FIG. 16, a metal layer may be formed on an exposed surface of the oxygen-enriched layer. For example, referring to FIG. 13C, the metal gate 141 may be disposed on the crystal grain boundary plugging layer 143. The metal gate 141 may be disposed by using a method, such as ALD or CVD. Although uniform nucleation growth as described above is important, a step coverage during a process for depositing and growing the metal gate 141 is also important. The step coverage may depend at least partially on a surface oxygen concentration, such as an oxygen concentration at the first interface IF1. In other words, when the oxygen concentration at the first interface IF1 is low, the rate at which the metal gate 141 is deposited and grown is fast, but the step coverage decreases, and thus device reliability may be lowered. On the other hand, when the oxygen concentration at the first interface IF1 is high, the rate at which the metal gate 141 is deposited and grown is slow, but the step coverage may be increased, and thus and the device reliability may be increased. However, inventive concepts are not limited to a particular theory.

The oxygen concentration at the first interface IF1 as described above may depend, for example, on a time period for which the metal nitride film 147a contacts a liquid oxidizing agent, a temperature, a concentration of the liquid oxidizing agent, and an oxidizing ability of the liquid oxidizing agent. Therefore, by adjusting these factors, an appropriate oxygen concentration at the first interface IF1 may be obtained.

Meanwhile, only the blocking insulation film 134 of the data storage element 130 may be disposed in the recessed region 126, and the tunnelling insulation film 132 and the charge storage film 133 may be disposed in the cell holes H.

According to some example embodiments, all of the tunnelling insulation film 132, the charge storage film 133, and the blocking insulation film 134 constituting the data storage element 130 may be disposed in the recessed region 126 (see FIG. 10F). In this case, the protective film 131 may not be provided. In the operations shown in FIGS. 10C and 10D, the cell pillars PL may be formed in the cell holes H without disposing the protective film 131, the charge storage film 133, and the tunnelling insulation film 132. The cell pillars PL may be formed by depositing a semiconductor film in the cell holes H. Thereafter, in the operation shown in FIG. 10G, the tunnelling insulation film 132, the charge storage film 133, and the blocking insulation film 134 may be sequentially disposed in the recessed region 126. Next, the gate electrode structure 140 may be formed on the blocking insulation film 134.

According to some example embodiments, the charge storage film 133 and the blocking insulation film 134 may be disposed in the recessed region 126. In the operations shown in FIGS. 10C and 10D, the cell pillars PL may be formed after the protective film 131 and the tunnelling insulation film 132 are disposed in the cell holes H. The cell pillars PL may be formed in a manner similar to that in the operations shown in FIGS. 10C and 10D. Thereafter, in the operation shown in FIG. 10G, the charge storage film 133 and the blocking insulation film 134 may be sequentially disposed in the recessed region 126. Next, the gate electrode structure 140 may be formed on the blocking insulation film 134.

According to some example embodiments, all of the tunnelling insulation film 132, the charge storage film 133, and the blocking insulation film 134 constituting the data storage element 130 may be disposed in the cell holes H. In the operations shown in FIGS. 10C and 10D, the protective film 131, the blocking insulation film 134, the charge storage film 133, and the tunnelling insulation film 132 are sequentially formed in the cell holes H. The cell pillars PL may be formed on the tunnelling insulation film 132. The cell pillars PL may be formed in a manner similar to that in the operations shown in FIGS. 10C and 10D. Next, in the operation shown in FIG. 10G, the gate electrode structure 140 may be formed in the recessed region 126.

According to some example embodiments, the data storage element 130 may be a variable resistance pattern. The variable resistance pattern may include at least one of materials having variable resistance characteristics.

For example, the data storage element 130 may include a material (e.g., a phase change material) whose electrical resistance may be changed by heat generated by a current flowing through an electrode adjacent thereto. The phase change material may include at least one of antimony (Sb), tellurium (Te), or selenium (Se). For example, the phase change material may include a chalcogen compound containing a tellurium (Te) from about 20 atomic percent to about 80 atomic percent, an antimony (Sb) from about 5 atomic percent to about 50 atomic percent, and germanium (Ge) for balance. Furthermore, the phase change material may include at least one of N, O, C, Bi, In, B, Sn, Si, Ti, Al, Ni, Fe, Dy, or La as impurities. Alternatively, the variable resistance pattern may include one from among GeBiTe, InSb, GeSb, and GaSb.

In another example, the data storage element 130 may be disposed to have a thin-film structure whose electrical resistance may be changed by using a spin transfer process based on a current flowing therethrough. The data storage element 130 may have a thin-film structure configured to exhibit magnetoresistance characteristics and may include at least one ferromagnetic material and/or at least one antiferromagnetic material.

In another example, the data storage element 130 may include at least one of perovskite compounds or transition metal oxides. For example, the data storage element 130 may include at least one of niobium oxide, titanium oxide, nickel oxide, zirconium oxide, vanadium oxide, PCMO (Pr, Ca) $MnO_3$, strontium-titanium oxide, barium-strontium-titanium oxide, strontium-zirconium oxide, barium-zirconium oxide, or barium-strontium-zirconium oxide.

In this case, the cell pillars PL may be conductive pillars. The cell pillars PL may include a conductive material. The conductive material may include at least one of, for example, a doped semiconductor, a metal, a conductive metal nitride, a silicide, or a nanostructure (such as carbon nanotubes or graphene).

For such a structure, in the operations shown in FIGS. 10C and 10D, the protective film 131 and the data storage element 130 are sequentially formed in cell holes H. The cell pillars PL may be formed on the data storage element 130. The cell pillars PL may be formed by depositing a conductive material. Thereafter, in the operation shown in FIG. 10G, the conductive film 140a may be formed in the recessed region 126.

Figure 10H:
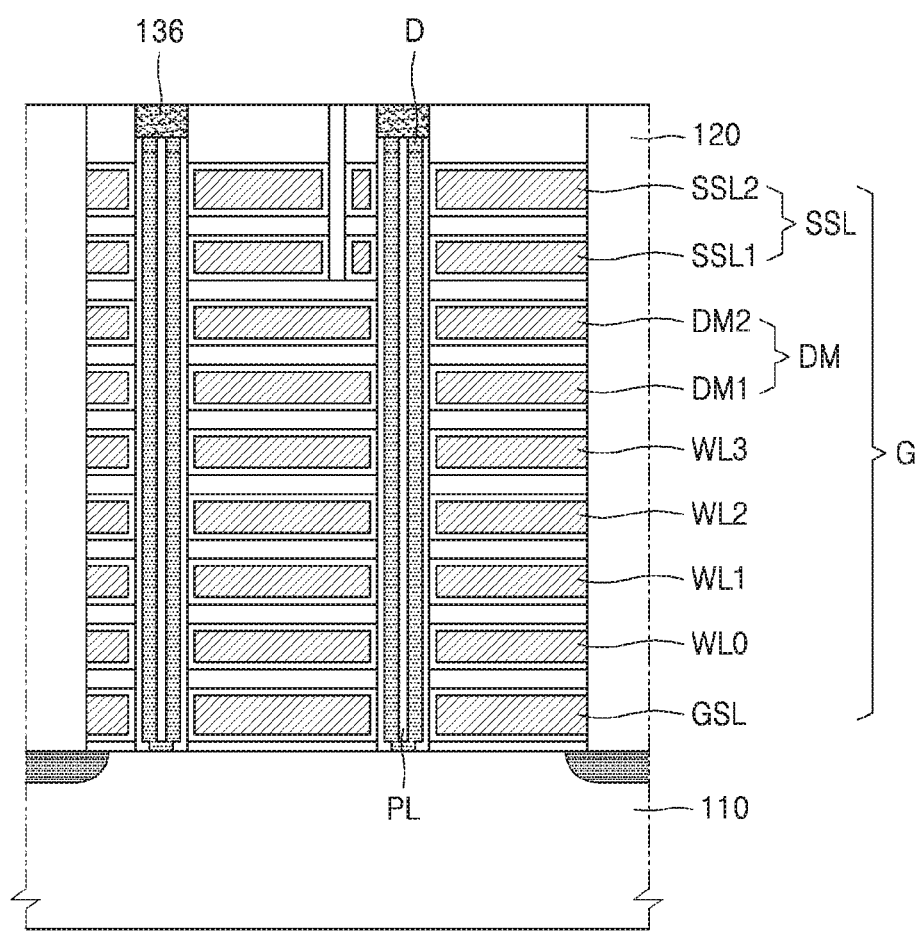

Next, referring to FIG. 10H, a portion of the gate electrode structure 140 formed outside the recessed region 126 is removed. Therefore, horizontal electrodes are formed in the recessed regions 126. The horizontal electrodes may include the ground select line GSL, the first through fourth word lines WL0 through WL3, the dummy word lines DM1 and DM2, and the string select lines SSL1 and SSL2. Each of the upper string select lines SSL1 and SSL2 may be split into two, which extend along the first direction D1.

The gate electrode structure 140 formed in the isolating regions 121 may be removed, and thus the substrate 110 may be exposed. Impurity ions of a second conductivity type may be densely provided on the exposed substrate 110, and thus the common source lines CSL may be formed.

An isolating insulation film 120 filling the isolating regions 121 is disposed. The cell pillars PL aligned along the second direction D2 may be connected to one upper wire BL1 or BL2 in common (See FIG. 4).

Figure 14:
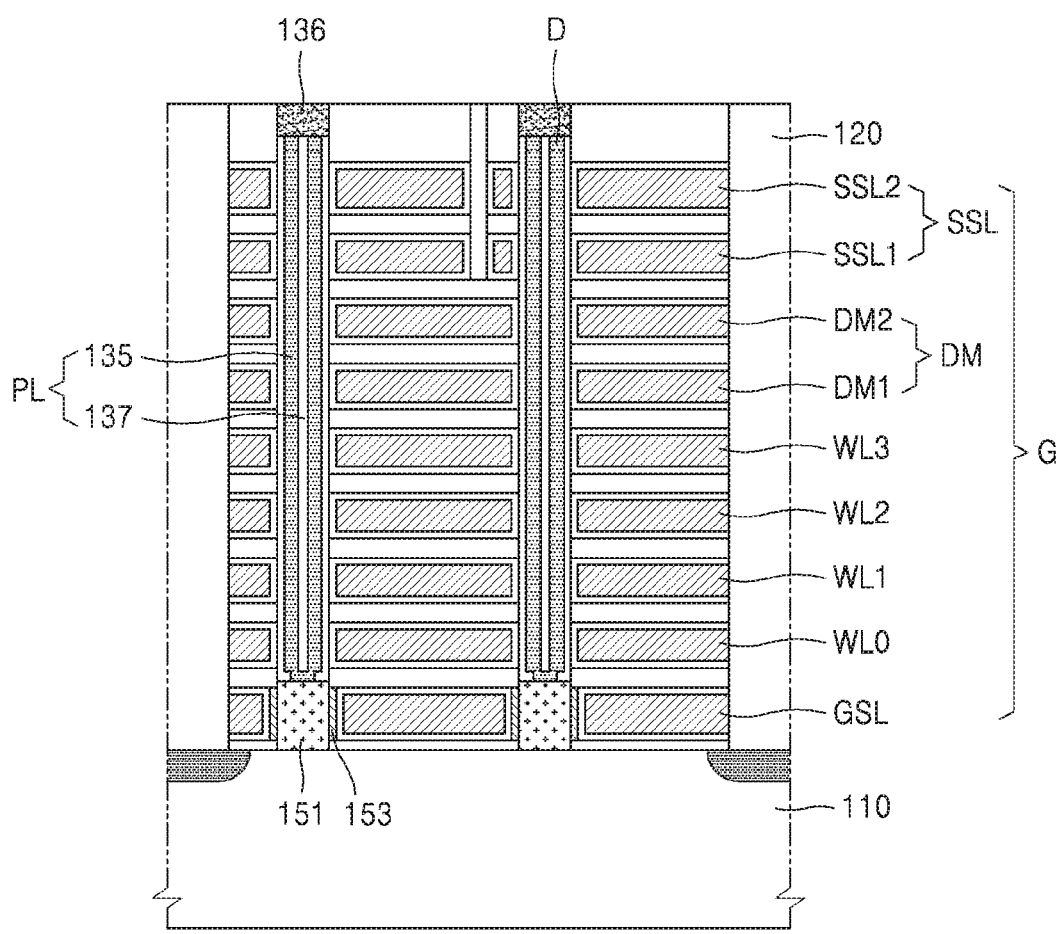
FIG. 14 is a lateral cross-sectional view of a semiconductor memory device around a cell pillar, according to some example embodiments of inventive concepts.

FIG. 14 is a lateral cross-sectional view of a semiconductor memory device according to some example embodiments of inventive concepts around a cell pillar. The embodiment shown in FIG. 14 differs from the embodiment shown in FIG. 4 in that a channel contact region 151 is further formed at the bottoms of the cell holes H. Herein-after, descriptions identical to those given above with reference to FIG. 4 will be omitted below, and a semiconductor memory device will be described based on differences between the embodiment shown in FIG. 4 and the embodiment shown in FIG. 14.

Referring to FIG. 14, after the cell hole H is formed as in FIG. 10B, the channel contact region 151 may be formed on the substrate 110 exposed at the bottom of the cell hole H. According to some embodiments, the channel contact region 151 may be grown from the exposed substrate 110 via selective epitaxial growth (SEG). At this time, the level of the top surface of the channel contact region 151 may be higher than the top surface of the lowermost sacrificial layer 123.

Next, a p-type impurity may be implanted into the channel contact region 151 via an ion implantation process. For example, the p-type impurity may be aluminum (Al), boron (B), indium (In), or potassium (K), and a concentration of the p-type impurity may be within the range from $5E^{16}$ atoms/cm$_3$ to $1E^{19}$ atoms/cm$_3$. Alternatively, the p-type impurity may be doped in-situ during the growth of the channel contact region 151 via the SEG process.

Next, after the cell pillars PL and the isolating regions are formed as shown in FIGS. 10C through 10E, the sacrificial films 123 are removed as shown in FIG. 10F, and an auxiliary gate insulation film 153 may be disposed by performing thermal oxidation process onto the sidewalls of the channel contact region 151. The auxiliary gate insulation film 153 may be a thermally-oxidized film formed as a portion of the SEG-grown channel contact region 151 is thermally oxidized. However, a thermal oxidation process for disposing the auxiliary gate insulation film 153 may be omitted.

Next, after the blocking insulating film 134, the tunnelling insulation film 132, and the charge storage film 133 are disposed and the conductive film 140a is disposed as shown in FIGS. 10G and 10H, the isolating insulation film 120 filling the isolating regions 121 may be disposed.

Figure 15:
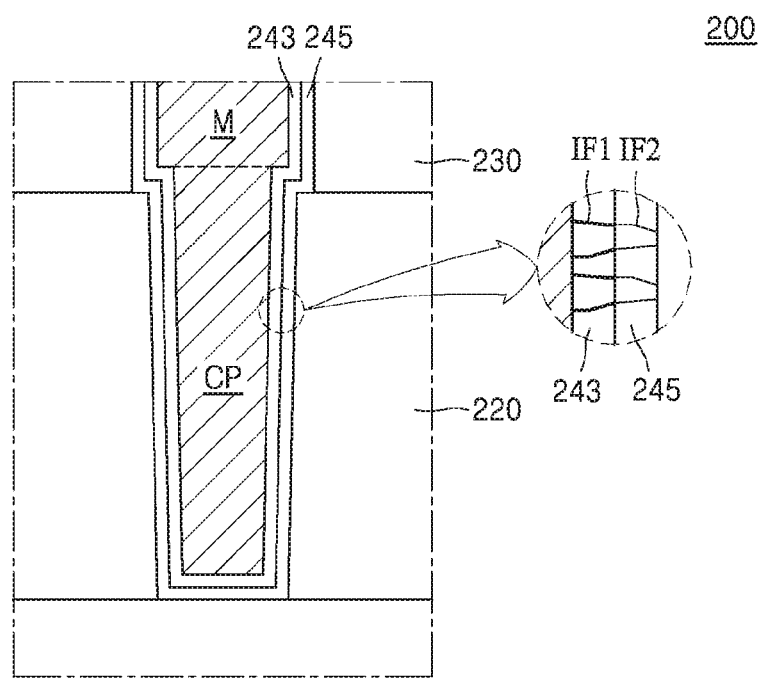
FIG. 15 is a lateral cross-sectional view of a conductor structure according to some example embodiments of inventive concepts.

FIG. 15 is a lateral cross-sectional view of a conductor structure 200 according to some example embodiments of inventive concepts.

Referring to FIG. 15, the conductor structure 200 may include a horizontal line wire M and a contact plug CP. The horizontal line wire M and the contact plug CP may be formed in a space defined by insulation layers 220 and 230. However, the conductor structure according to some example embodiments of inventive concepts is not limited to the horizontal line wire M and the contact plug CP.

The contact plug CP may be electrically connected to another wire layer, an active device like a transistor, or a passive device like a capacitor.

The contact plug CP may extend along vertical directions of FIG. 15, and the horizontal line wire M may extend in a direction of a gaze of a viewer. There may be an interface between the horizontal line wire M and the contact plug CP or there may be no interface between the horizontal line wire M and the contact plug CP as the horizontal line wire M and the contact plug CP are integrally formed. The horizontal line wire M and contact plug CP may include a metal, such as tungsten (W), aluminum (Al), copper (Cu), titanium (Ti), tantalum (Ta), and platinum (Pt).

A crystal grain boundary plugging layer 243 and a barrier film 245 may be provided on the surfaces of the horizontal line wire M and the contact plug CP. Since the crystal grain boundary plugging layer 243 and the barrier film 245 are identical to the crystal grain boundary plugging layer 143 and the barrier film 145 described above in detail with reference to FIGS. 5 through 9, detailed description thereof will be omitted. Since oxygen exists between the crystal grains of the crystal grain boundary plugging layer 243, the first interface IF1 may be formed. On the other hand, since oxygen does not exist between the crystal grains of the barrier film 245, the second interface IF2 may be formed. The oxygen may be present in the form of atoms, molecules, ions, radicals, or a metal oxide.

In a semiconductor memory device and/or conductor structure according to some example embodiments of inventive concepts, since the content of halogen atoms that may remain in a crystal grain boundary plugging layer may be significantly reduced, a metal conductor may grow very uniformly, thereby improving reliability of the a semiconductor memory device. Furthermore, since a crystal grain boundary plugging layer is provided above a barrier film, the step coverage may be improved due to the presence of oxygen, and thus a metal conductor may be uniformly grown. As a result, reliability of the semiconductor memory device may be further improved.

While inventive concepts has been particularly shown and described with reference to embodiments thereof, it will be understood that various changes in form and details may be made therein without departing from the spirit and scope of the following claims.

What is claimed is:

1. A semiconductor memory device comprising:
   a substrate;
   a plurality of gate electrode structures stacked on the substrate, each of the plurality of gate electrode structures including a barrier film, a metal gate, and a crystal grain boundary plugging layer between the barrier film and the metal gate;
   insulation patterns between the plurality of gate electrode structures;
   vertical channels penetrating through the plurality of gate electrode structures and the insulation patterns, the vertical channels being electrically connected to the substrate; and
   a data storage pattern between the plurality of gate electrode structures and the vertical channels.

2. The semiconductor memory device of claim 1, wherein the barrier film includes a polycrystalline metal nitride.

3. The semiconductor memory device of claim 2, wherein the crystal grain boundary plugging layer includes oxygen at interfaces between crystal grains.

4. The semiconductor memory device of claim 3, wherein the oxygen at interfaces between the crystal grains of the crystal grain boundary plugging layer is in a form of atoms, molecules, ions, radicals, or a metal oxide.

5. The semiconductor memory device of claim 3, wherein the oxygen existing in the interfaces between the crystal grains of the crystal grain boundary plugging layer is observable via atom probe tomography (APT).

6. The semiconductor memory device of claim 3, wherein
   the barrier film includes crystal grains, and
   the crystal grains of the crystal grain boundary plugging layer are identical to the crystal grains of the barrier film.

7. The semiconductor memory device of claim 3, wherein at least one crystal grain of a metal nitride exists across the barrier film and the crystal grain boundary plugging layer.

8. The semiconductor memory device of claim 3, wherein at least one crystal grain of a metal nitride exists throughout an overall thickness of the barrier film and the crystal grain boundary plugging layer.

9. The semiconductor memory device of claim 3, wherein
the barrier film and crystal grain boundary layer include crystal grains of a metal nitride are distributed throughout an overall thickness of the barrier film and the crystal grain boundary plugging layer,
oxygen exists along interfaces between the crystal grains in the crystal grain boundary plugging layer, and
oxygen does not exist along interfaces between the crystal grains in the barrier film, and
interfaces between the crystal grains in the barrier film extend continuously from the interfaces of the crystal grain boundary plugging layer.

10. The semiconductor memory device of claim 2, wherein the metal nitride includes at least one of titanium nitride (TiN), tantalum nitride (TaN), tungsten nitride (WN), molybdenum nitride (MoN), niobium nitride (NbN), titanium oxynitride (TiON), tungsten silicon nitride (WSiN), molybdenum silicon nitride (MoSiN), tantalum silicon nitride (TaSiN), or titanium silicon nitride (TiSiN).

11. The semiconductor memory device of claim 2, wherein a thickness of the crystal grain boundary plugging layer is in a range of about 2 angstroms to about 20 angstroms.

12. The semiconductor memory device of claim 2, wherein a content of halogen atoms in the crystal grain boundary plugging layer is lower than a content of halogen atoms in the barrier film.

13. The semiconductor memory device of claim 2, wherein halogen atoms do not substantially exist in the crystal grain boundary plugging layer.

14. A conductor structure comprising:
an insulation layer including a recessed portion;
a barrier film conformally disposed in the recessed portion;
a metal layer on the barrier film, the metal layer filling the recessed portion; and
a crystal grain boundary plugging layer between the barrier film and the metal layer.

15. The conductor structure of claim 14, wherein the conductor structure is a horizontal line wire or a contact plug.

16. The conductor structure of claim 14, wherein
the crystal grain boundary plugging layer includes oxygen at interfaces between crystal grains of the crystal grain boundary plugging layer, and
the oxygen is in a form of atoms, molecules, ions, radicals, or a metal oxide.

* * * * *